(12) United States Patent
Morishita

(10) Patent No.: US 11,404,780 B2
(45) Date of Patent: Aug. 2, 2022

(54) PHASE SHIFTER AND WIRELESS COMMUNICATION APPARATUS

(71) Applicant: Panasonic Corporation, Osaka (JP)

(72) Inventor: Yohei Morishita, Kanagawa (JP)

(73) Assignee: Panasonic Holdings Corporation, Osaka (JP)

( * ) Notice: Subject to any disclaimer, the term of this patent is extended or adjusted under 35 U.S.C. 154(b) by 698 days.

(21) Appl. No.: 16/355,201

(22) Filed: Mar. 15, 2019

(65) Prior Publication Data

US 2019/0305420 A1 Oct. 3, 2019

(30) Foreign Application Priority Data

Mar. 27, 2018 (JP) .............................. JP2018-060716
Oct. 26, 2018 (JP) .............................. JP2018-202040

(51) Int. Cl.
*H01Q 3/00* (2006.01)
*H01Q 3/36* (2006.01)
*H03K 5/01* (2006.01)
*H03K 5/00* (2006.01)

(52) U.S. Cl.
CPC .............. *H01Q 3/36* (2013.01); *H03K 5/01* (2013.01); *H03K 2005/00286* (2013.01)

(58) Field of Classification Search
CPC ... H01Q 3/36; H03K 5/01; H03K 2005/00286
USPC ...................................................... 342/372
See application file for complete search history.

(56) References Cited

U.S. PATENT DOCUMENTS

| 2009/0278624 A1* | 11/2009 | Tsai .......................... H01P 1/18 333/167 |
| 2010/0171567 A1* | 7/2010 | Krishnaswamy ....... H01P 1/185 333/164 |
| 2012/0105172 A1* | 5/2012 | Tsai .......................... H03H 7/20 333/164 |
| 2013/0152686 A1* | 6/2013 | Venkatraman .......... G01P 15/18 73/514.32 |
| 2014/0287704 A1* | 9/2014 | Dupuy ..................... H01Q 3/24 455/114.2 |
| 2015/0270821 A1* | 9/2015 | Natarajan ................ H03H 7/48 455/78 |
| 2018/0212590 A1* | 7/2018 | Shrivastava ........... H03H 11/20 |

OTHER PUBLICATIONS

A 60GHz digitally controlled RF-beamforming receiver front-end in 65nm CMOS : "A 1,5-to-5.0GHz input-matched +2dBm PldB all-passive switched-capacitor beamforming receiver frontend in 65pm CMOS" (Year: 2009).*

(Continued)

*Primary Examiner* — Ryan Jager
(74) *Attorney, Agent, or Firm* — Seed IP Law Group LLP

(57) ABSTRACT

A phase shifter includes a first capacitor connected to a first line to which a first input signal is input, a second capacitor connected to a second line to which a second input signal having a first phase difference with respect to the first input signal is input, and a combining circuit that is connected to the first line and the second line and that outputs a combined signal having a phase determined depending on a first capacitance ratio between the first capacitor and the second capacitor.

9 Claims, 16 Drawing Sheets

(56) References Cited

OTHER PUBLICATIONS

A 60GHz Digitally Controlled Phase Shifter m CMOS : "A 60GHz digitally controlled RF-beamforming receiver front-end in 65nm CMOS" (Year: 2008).*

Michiel Soer et al., "A 1.5-to-5.0GHz Input-Matched +2dBm P1dB All-Passive Switched-Capacitor Beamforming Receiver Front-End in 65nm CMOS", IEEE, ISSCC 2012, 9.7, Feb. 19, 2012.

Takaya Maruyama et al., "1.4 deg.-rms 6-bit Vector-Sum Phase Shifter Calibrating I-Q Generator Error by VGA for High SHF Wide-Band Massive MIMO in 5G.", Proceedings of the Asia-Pacific Microwave Conference 2016, TH3C-3, IEEE, Dec. 5, 2016.

Kwang-Jin Koh et al., "A 6-18 GHz 5-Bit Active Phase Shifter", Published in: 2010, IEEE MTT-S International Microwave Symposium, Date of Conference: May 23-28, 2010.

English Translation of Chinese Search Report dated May 25, 2021 for the related Chinese Patent Application No. 201910171050.9.

Yikun Yu et al.: "A 60GHz digitally controlled RF-beamforming receiver front-end in 65nm CMOS", 2009 IEEE Radio Frequency Integrated Circuits Symposium, Jun. 26, 2009, Paragraph 2 of p. 211's right column to Paragraph 1 of p. 212's left column and Fig.1.

Yikun Yu et al.: "A 60GHz Digitally Controlled Phase Shifter in CMOS", ESSCIRC 2008—34th European Solid-State Circuits Conference, Nov. 18, 2008, Paragraph 2 of p. 250's right column's to Paragraph 2 of p. 251's left column's, and Fig.2.

* cited by examiner

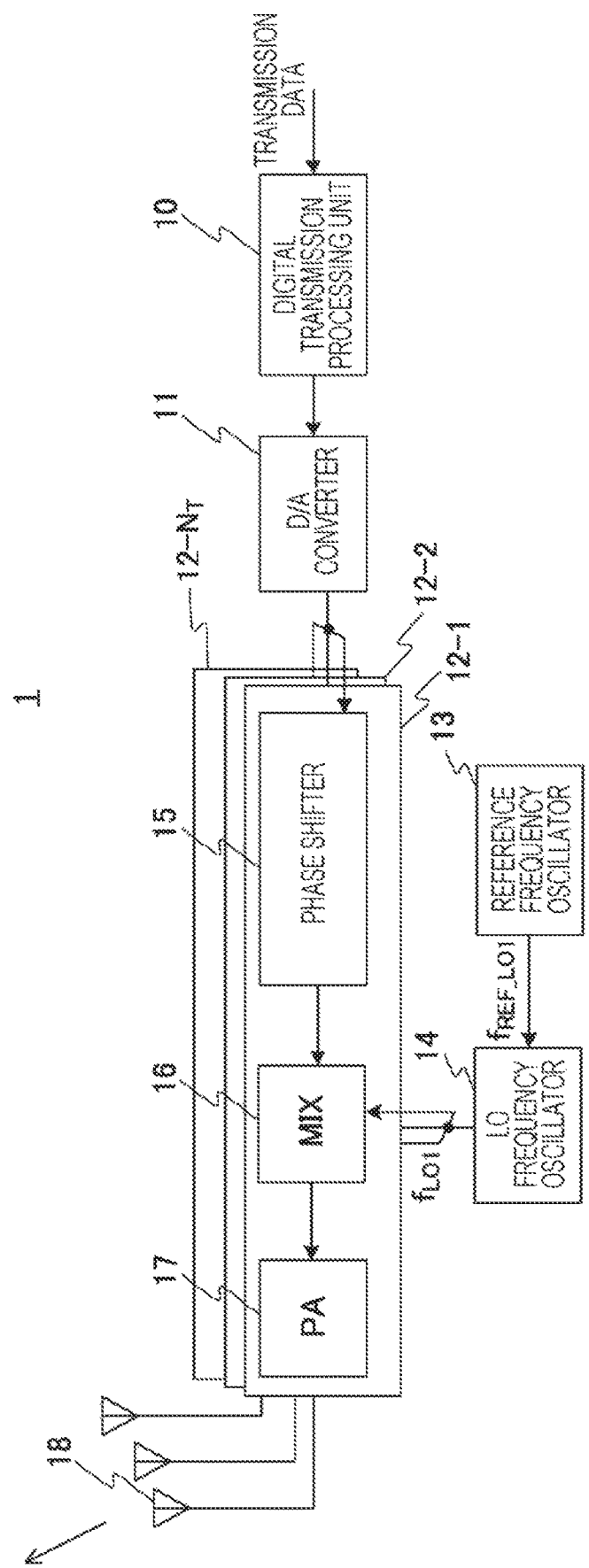

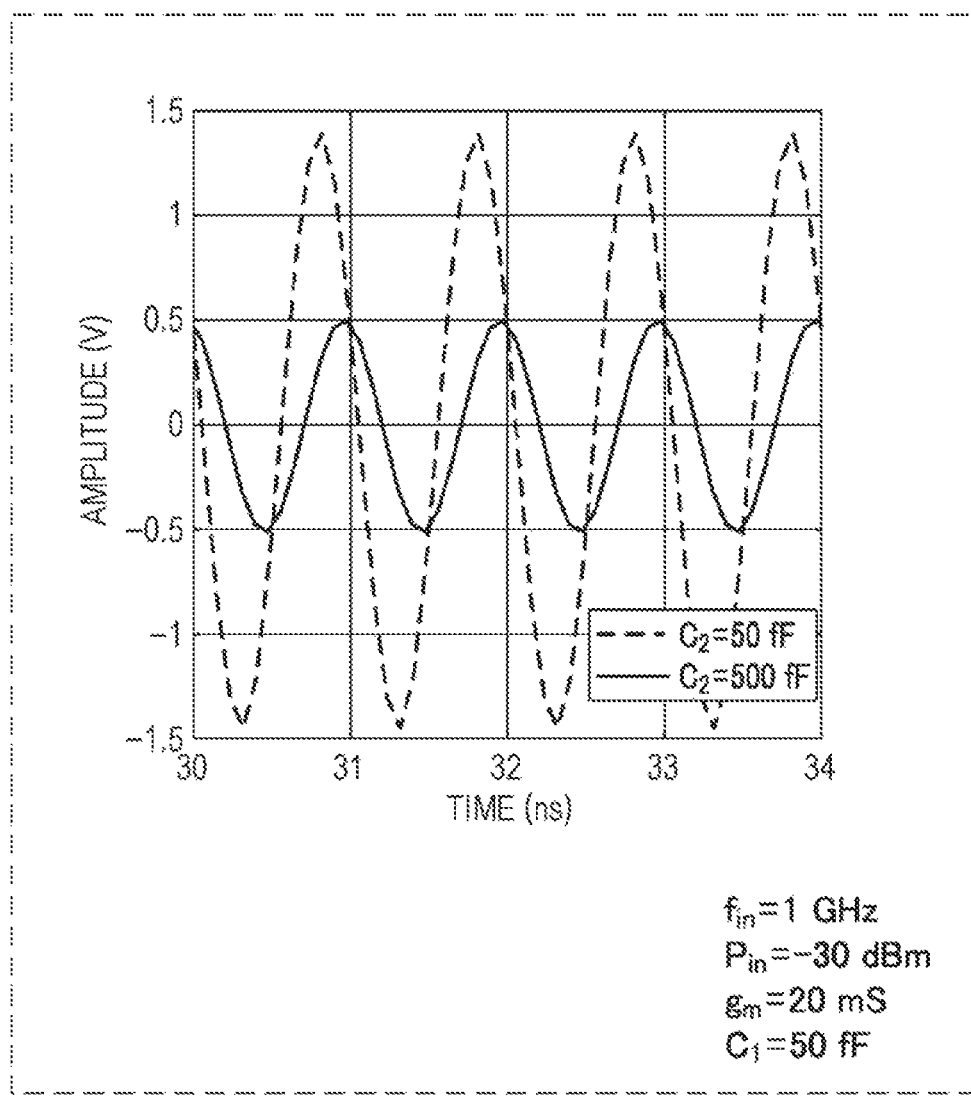

PHASE SHIFTER AND WIRELESS COMMUNICATION APPARATUS

BACKGROUND

1. Technical Field

The present disclosure relates to a phase shifter and a wireless communication apparatus.

2. Description of the Related Art

In the field of wireless communication, a beamforming technique is known. In this technique, a phase of a signal transmitted or received via each of a plurality of antennas is adjusted individually for each antenna such that a beam is formed in a desired direction.

As one of methods of achieving a beamforming receiver using a fine Complementary Metal-Oxide-Semiconductor (CMOS) process, it is known to use a phase shifter configured based on a discrete-time analog circuit.

For example, a phase shifter using a discrete-time analog circuit is disclosed in Michiel Soer, Eric Klumperink, Bram Nauta, Frank van Vliet "A 1.5-to-5.0 GHz input-matched+2 dBm P1 dB all-passive switched-capacitor beamforming receiver front-end in 65 nm CMOS", ISSCC Dig. Tech. Papers, pp. 174-175, February 2012. In this technique, a continuous-time analog signal is converted to a discrete-time analog signal using switches, and the gain of the discrete-time analog signal is adjusted thereby controlling the phase of the discrete-time analog signal.

SUMMARY

However, in this phase shifter described above, a large number of switches for converting a continuous-time analog signal to a discrete-time analog signal are provided in a path of the continuous-time analog signal, and thus it is difficult to achieve a high-speed operation, which makes it difficult to deal with a wideband signal.

One non-limiting and exemplary embodiment provides a phase shifter and a wireless communication apparatus capable of operating at a high speed to deal with a wideband signal.

In one general aspect, the techniques disclosed here feature a phase shifter including a first capacitor connected to a first line to which a first input signal is input, a second capacitor connected to a second line to which a second input signal having a first phase difference with respect to the first input signal is input, and, a combining circuit that is connected to the first line and the second line and that outputs a combined signal having a phase determined depending on a first capacitance ratio between the first capacitor and the second capacitor.

The phase shifter and the wireless communication apparatus based on the techniques disclosed here are capable of operating at a high speed to handle a wideband signal.

General or specific embodiments may be implemented as a system, an apparatus, a method, an integrated circuit, a computer program, or a storage medium or any combination of a system, an apparatus, a method, an integrated circuit, a computer program, and a storage medium.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1A is a diagram illustrating an example of a configuration of a transmission apparatus according to a first embodiment of the present disclosure;

FIG. 3 is a diagram illustrating an example of a result of simulation of an output waveform output from a phase shifter according to the first embodiment of the present disclosure;

DETAILED DESCRIPTION

Embodiments of the present disclosure are described in detail below with reference to drawings. Note that the embodiments described below are merely examples, and the present disclosure is not limited to these examples.

First Embodiment

Configurations of Transmission Apparatus and Reception Apparatus

Figure 1B:
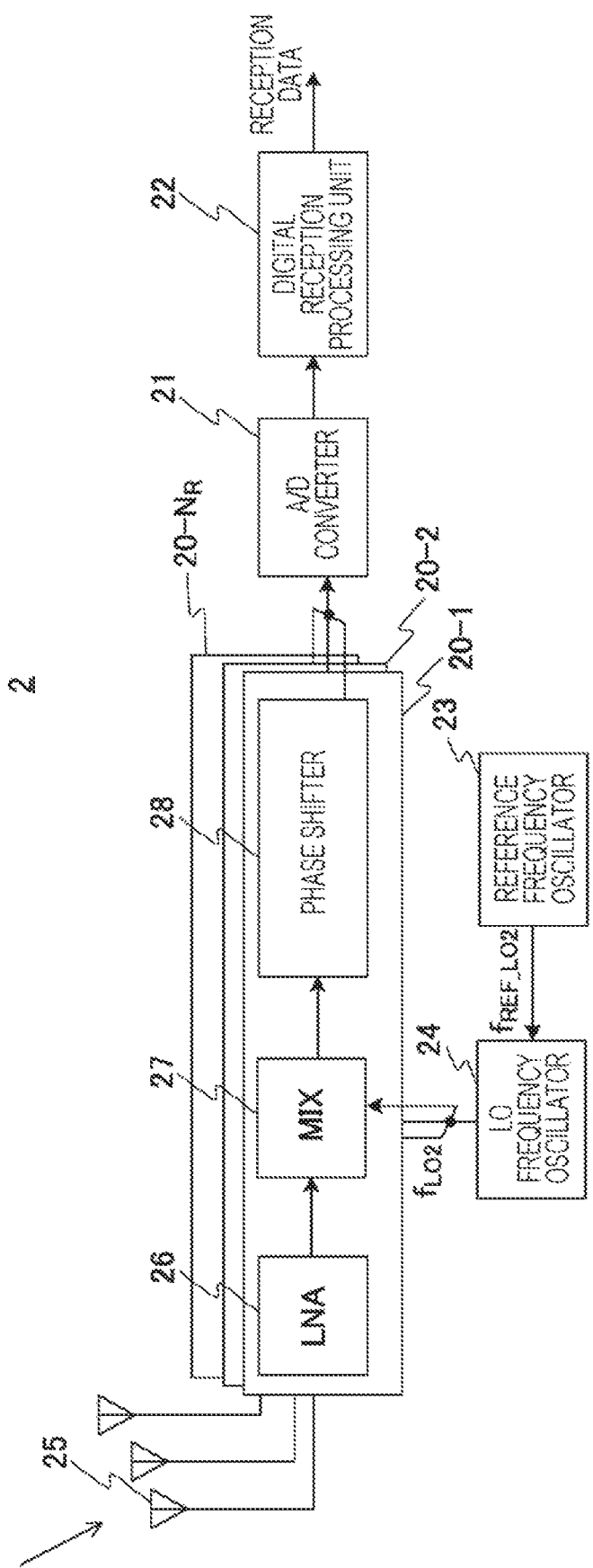
FIG. 1B is a diagram illustrating an example of a configuration of a reception apparatus according to the first embodiment of the present disclosure.

FIG. 1A is a diagram illustrating an example of a configuration of a transmission apparatus 1 according to a first embodiment of the present disclosure. FIG. 1B is a diagram illustrating an example of a configuration of a reception apparatus 2 according to the first embodiment of the present disclosure. Note that in the following description, expressions such as " . . . er", " . . . or" or the like used to indicate constituent elements of the transmission apparatus 1 or the reception apparatus 2 may be replaced by other expressions such as " . . . circuitry", . . . device", . . . unit", . . . module", or the like.

The transmission apparatus 1 shown in FIG. 1A includes, for example, a digital transmission processing unit 10, a D/A (Digital to Analog) converter 11, $N_T$ analog transmission processing units 12 (analog transmission processing units 12-1 to 12-$N_T$), a reference frequency oscillator 13, and an LO (Local Oscillator) frequency oscillator 14, where $N_T$ is an integer greater than or equal to 1.

The analog transmission processing units 12-1 to 12-$N_T$ have the same configuration, and thus the analog transmission processing unit 12-1 is taken as an example in the following description. The analog transmission processing unit 12-1 includes, for example, a phase shifter 15, a transmission mixer (MIX) 16, a power amplifier (PA) 17, and an antenna 18.

The digital transmission processing unit 10 performs a predetermined digital transmission process including, for example, a coding process and a modulation process on transmission data thereby generating a baseband digital transmission signal, and the digital transmission processing unit 10 outputs the resultant baseband digital transmission signal to the D/A converter 11.

The D/A converter 11 converts the baseband digital transmission signal to a baseband analog transmission signal. The D/A converter 11 outputs the baseband analog transmission signal to the analog transmission processing units 12-1 to 12-$N_T$.

The reference frequency oscillator 13 generates a reference frequency signal $f_{REF\_LO1}$ used in generating a local oscillation signal $f_{LO1}$ and outputs it to the LO frequency oscillator 14.

The LO frequency oscillator 14 generates the local oscillation signal $f_{LO1}$ based on the reference frequency signal $f_{REF\_LO1}$ and outputs the resultant local oscillation signal $f_{LO1}$ to the transmission mixer 16.

The phase shifter 15 controls the phase of the baseband analog transmission signal. For example, the phase shifter 15 controls the phase of the baseband analog transmission signal to a phase corresponding to the direction of a beam formed by the transmission apparatus 1. The phase shifter 15 outputs the phase-controlled baseband analog transmission signal to the transmission mixer 16. The magnitude of the phase controlled by the phase shifter 15 is specified, for example, by a not-illustrated control unit.

Note that an example of a configuration and an example of an operation of the phase shifter 15 will be described later.

The transmission mixer 16 up-converts the phase-controlled baseband analog transmission signal based on the local oscillation signal $f_{LO1}$ to an RF frequency (radio frequency), and outputs a resultant analog transmission signal up-converted to the RF frequency to the power amplifier 17.

The power amplifier 17 amplifies power of the analog transmission signal up-converted to the RF frequency and outputs the resultant analog transmission signal to the antenna 18.

The antenna 18 radiates the power-amplified analog transmission signal.

The phase shifter 15 provided in each of the analog transmission processing units 12-1 to 12-$N_T$ controls the phase of the baseband analog transmission signal such that signals (beams) are controlled so as to be transmitted in desired directions from the antennas 18 of the respective analog transmission processing units 12-1 to 12-$N_T$.

The reception apparatus 2 shown in FIG. 1B includes, for example, $N_R$ analog reception processing units 20 (analog reception processing units 20-1 to 20-$N_R$), an A/D (Analog to Digital) converter 21, a digital reception processing unit 22, a reference frequency oscillator 23, and an LO frequency oscillator 24 where $N_R$ is an integer greater than or equal to 1.

The analog reception processing units 20-1 to 20-$N_R$ have the same configuration, and thus the analog reception processing unit 20-1 is taken as an example in the following description. The analog reception processing unit 20-1 includes, for example, an antenna 25, a low noise amplifier (LNA) 26, a reception mixer (MIX) 27, and a phase shifter 28.

The antenna 25 receives an analog reception signal with an RF frequency from a not-illustrated transmission apparatus and outputs the received analog reception signal to the low noise amplifier 26.

The low noise amplifier 26 amplifies the received RF-frequency analog reception signal, and outputs the resultant received analog reception signal to the reception mixer 27.

The reference frequency oscillator 23 generates a reference frequency signal $f_{REF\_LO2}$ used in generating a local oscillation signal $f_{LO2}$, and outputs the generated reference frequency signal $f_{REF\_LO2}$ to the LO frequency oscillator 24.

The LO frequency oscillator 24 generates the local oscillation signal $f_{LO2}$ based on the reference frequency signal $f_{REF\_LO2}$, and outputs the generated local oscillation signal $f_{LO2}$ to the reception mixer 27.

The reception mixer 27 converts the frequency of the RF-frequency analog reception signal to a baseband analog reception signal based on the local oscillation signal $f_{LO2}$, and outputs the resultant baseband analog reception signal to the phase shifter 28.

The phase shifter 28 controls the phase of the baseband analog reception signal. For example, the phase shifter 28 controls the phase of the baseband analog reception signal to a phase corresponding to the direction of the beam formed by the reception apparatus 2. The phase shifter 28 outputs the phase-controlled baseband analog reception signal to the A/D converter 21. The phase controlled by the phase shifter 28 is specified, for example, by a not-illustrated control unit.

That is, the signal input to the A/D converter 21 is a signal obtained by combining the baseband analog reception signals with the phases controlled by the phase shifters 28 of the respective analog reception processing units 20-1 to 20-$N_R$. The A/D converter 21 converts the combined baseband analog reception signal to a baseband digital reception signal, and outputs the resultant baseband digital reception signal to the digital reception processing unit 22. Note that in the example shown in FIG. 1B, the baseband analog reception signals with phases controlled by the phase shifters 28 of the respective analog reception processing units 20-1 to 20-$N_R$ are combined together by the single A/D converter 21. Alternatively, for example, a plurality of A/D converters 21 may be provided such that the baseband analog reception signals with phases controlled by the phase shifters 28 of the respective analog reception processing units 20-1 to 20-$N_R$ are individually converted into baseband digital reception signals by the respective A/D converters 21. The baseband digital reception signals obtained as a result of being converted by the plurality of A/D converters 21 may be combined.

The digital reception processing unit 22 performs a predetermined digital reception process including, for example, a demodulation process and a decoding process and/or the like on the baseband digital reception signal thereby generating reception data and outputs the resultant reception data.

Note that the transmission apparatus 1 shown in FIG. 1A and the reception apparatus 2 shown in FIG. 1B each have a direct conversion configuration. In the transmission apparatus 1 or the reception apparatus 2 according to the first embodiment, one or more mixers may be added, and a process at an intermediate frequency (IF) may be performed.

In a case where the transmission apparatus 1 shown in FIG. 1A and the reception apparatus 2 shown in FIG. 1B are included in one communication apparatus, the reference frequency signal $f_{REF\_LO1}$ and the reference frequency signal $f_{REF\_LO2}$ may be shared by the transmission signal processing and the reception signal processing. The reference frequency oscillator 13 and the reference frequency oscillator 23 may be shared by the transmission apparatus 1 and the reception apparatus 2, while the LO frequency oscillator 14 and the LO frequency oscillator 24 may be shared by the transmission apparatus 1 and the reception apparatus 2.

In the example shown in FIG. 1A, the phase shifter 15 is disposed between the D/A converter 11 and the transmission mixer 16. However, the present disclosure is not limited to this example. The phase shifter 15 may be disposed between the transmission mixer 16 and the power amplifier 17, or between the LO frequency oscillator 14 and the transmission mixer 16.

In a case where the phase shifter 15 is disposed between the transmission mixer 16 and the power amplifier 17, the phase shifter 15 controls the phase of the analog transmission signal having been subjected to the up-conversion to the RF frequency.

In a case where the phase shifter 15 is disposed between the LO frequency oscillator 14 and the transmission mixer 16, the phase shifter 15 controls the phase of the local oscillation signal $f_{LO1}$. By controlling the phase of the local oscillation signal $f_{LO1}$, the phase of the analog transmission signal which is up-converted by the transmission mixer 16 based on the local oscillation signal $f_{LO1}$ is indirectly controlled.

In the example of the reception apparatus 2 shown in FIG. 1B, the phase shifter 28 is disposed between the reception mixer 27 and the A/D converter 21. However, the present disclosure is not limited to this example. The phase shifter 28 may be disposed between the low noise amplifier 26 and the reception mixer 27, or between the LO frequency oscillator 24 and the reception mixer 27.

In a case where the phase shifter 28 is disposed between the low noise amplifier 26 and the reception mixer 27, the phase shifter 28 controls the phase of the RF-frequency analog reception signal.

In a case where the phase shifter 28 is disposed between the LO frequency oscillator 24 and the reception mixer 27, the phase shifter 28 controls the phase of the local oscillation signal $f_{LO2}$. By controlling the phase of the local oscillation signal $f_{LO2}$, the phase of the analog reception signal which is down-converted by the reception mixer 27 based on the local oscillation signal $f_{LO2}$ is indirectly controlled.

Note that a gain control function (a variable gain amplifier) may be added to the phase shifter 15 and/or the phase shifter 28, or a function of a filter and/or a function of an equalizer may be added to the phase shifter 15 and/or the phase shifter 28. For example, the configuration of the phase shifter 15 and/or the phase shifter 28 may be changed to add at least one of functions including the gain control function, the filter function, and the equalizer function. Alternatively, to add the gain control function, a variable gain amplifier may be added. To add the filter function, a filter may be added. To add the equalizer function, an equalizer may be added.

Configuration and Operation of Phase Shifter 100

Next, referring to FIG. 2, an example of a configuration of the phase shifter 100 according to the first embodiment is described below. The phase shifter 100 described below corresponds to the phase shifter 15 shown in FIG. 1A and/or the phase shifter 28 shown in FIG. 1B.

Figure 2:
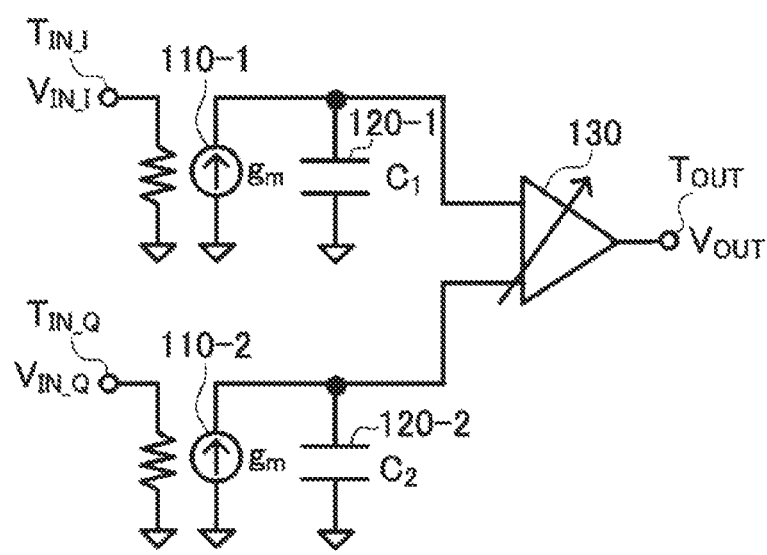
FIG. 2 is a diagram illustrating an example of a configuration of a phase shifter according to the first embodiment of the present disclosure.

FIG. 2 is a diagram illustrating an example of a configuration of the phase shifter 100 according to the first embodiment. The phase shifter 100 shown in FIG. 2 includes, for example, a TA (Transconductance Amplifier, voltage-to-current conversion circuit) 110-1, a TA 110-2, a capacitor 120-1, a capacitor 120-2, and a combining circuit 130.

The input terminal $T_{IN\_I}$ and the input terminal $T_{IN\_Q}$ of the phase shifter 100 are respectively input with the baseband analog signal $V_{IN\_I}$ and the analog signal $V_{IN\_Q}$. The phase shifter 100 outputs, from an output terminal $T_{OUT}$, an output signal $V_{OUT}$ obtained as a result of changing the phase of the analog signal $V_{IN\_I}$.

The analog signal $V_{IN\_I}$ and the analog signal $V_{IN\_Q}$ respectively correspond, for example, to an in-phase component (hereinafter, also referred to as an I-component) and a quadrature component (hereinafter also referred to as a Q-component), which are obtained as a result of being converted by a not-illustrated IQ mixer (IQ generation circuit). The phase difference between the analog signal $V_{IN\_I}$ and the analog signal $V_{IN\_Q}$ is, for example, 90°. The analog signal $V_{IN\_I}$ and the analog signal $V_{IN\_Q}$ input to the phase shifter 100 may also be referred to, respectively, as an input signal $V_{IN\_I}$ and an input signal $V_{IN\_Q}$.

In the example described above, a combination of the I-component and the Q-component output by the IQ mixer is used as an input signal. For example, the IQ mixer may be configured to output a four-phase signal including an I-component, a Q-component, an IB-component (a component opposite in phase to the I-component), and a QB-component (a component opposite in phase to the Q-component). In this case, one of four combinations, I and Q, I and QB, IB and Q, and IB and QB may be used as an input signal. Note that the phase difference between two signals input to the phase shifter 100 is n×π/2 (n is an integer greater than or equal to 1).

Note that a system that includes the TA 110-1 and the capacitor 120-1 shown in FIG. 2 and that operates in response to an input signal $V_{IN\_I}$ may be called an I-circuit. On the other hand, a system that includes the TA 110-2 and the capacitor 120-2 shown in FIG. 2 and that operates in response to an input signal $V_{IN\_Q}$ may be called a Q-circuit.

The TA 110-1 is a voltage-to-current conversion circuit in the I-circuit, and converts the input signal $V_{IN\_I}$ to a current $(g_m \times V_{IN\_I})$ where $g_m$ is a value of the transconductance of the TA 110-1.

One of electrodes of the capacitor 120-1 is connected to the output of the TA 110-1, and the other one of the electrodes is connected to GND (that is, grounded). The capacitor 120-1 has a capacitance value of $C_1$.

The TA 110-2 is a voltage-to-current conversion circuit in the Q-circuit, and converts the input signal $V_{IN\_Q}$ to a current $(g_m \times V_{IN\_Q})$ where $g_m$ is a value of the transconductance of the TA 110-2.

One of electrodes of the capacitor 120-2 is connected to the output of the TA 110-2, and the other one of the electrodes is connected to GND (that is, grounded). The capacitor 120-2 has a capacitance value of $C_2$.

At least one of the capacitor 120-1 and the capacitor 120-2 may be is a variable capacitor capable of adjusting the capacitance value.

The combining circuit 130 calculates the sum or the difference between the electric potentials at the terminals, opposite to the terminals connected to GND, of the respective capacitors 120-1 and 120-2, and outputs the result as the output signal $V_{OUT}$ from the output terminal $T_{OUT}$. The output signal $V_{OUT}$ may also be referred to as an output voltage signal.

An example of an operation of the phase shifter 100 is described below. In a case where $V_{IN\_I}$=sin ωt and $V_{IN\_Q}$=cos ωt are input to the phase shifter 100, the output signal $V_{OUT}$ is represented by equation (1) where ω is the angular frequency of the input signal and is represented as ω=2πf$_{in}$ using the frequency $f_{in}$ of the input signal.

$$V_{OUT} = \frac{g_m}{j\omega C_1}\sin \omega t + \frac{g_m}{j\omega C_2}\cos \omega t = R \sin(\omega t + \alpha) \quad (1)$$

The magnitude α of the difference in phase between the output signal $V_{OUT}$ and the input signal $V_{IN\_I}$=sin ωt is represented by equation (2).

$$\tan \alpha = \frac{C_1}{C_2} \quad (2)$$

Equation (2) indicates that the phase of the output signal $V_{OUT}$ is determined by a capacitance ratio. Hereinafter, the magnitude α of the difference in phase between the output signal $V_{OUT}$ and the input signal $V_{IN\_I}$ will also be referred to as a phase control amount.

In the first embodiment, the phase is controlled according to a theory described below. Note that this theory is employed also in other embodiments.

In a case where the I-circuit in the phase shifter 100 gives an amplitude A to the input signal $V_{IN}$I=sin ωt, and the Q-circuit gives an amplitude B to the input signal $V_{IN\_Q}$=cos ωt, the output voltage signal $V_{OUT}$ is given by equation (3).

$$V_{OUT}=A \sin \omega t+B \cos \omega t=\sqrt{A^2+B^2} \sin(\omega t+\alpha) \quad (3)$$

In equation (3), A and B each take a real or complex number. Note that A may be represented by a transfer function of the I-circuit, and B may be represented by a transfer function of the Q-circuit.

The phase control amount α is represented by equation (4).

$$\tan \alpha = \frac{B}{A} \quad (4)$$

Next, a phase control characteristic of the phase shifter 100 is described below. FIG. 3 is a diagram illustrating an example of a result of simulation of an output waveform output from the phase shifter 100 according to the first embodiment. In FIG. 3, a horizontal axis represents time, and a vertical axis represents an output voltage. The result of the simulation shown in FIG. 3 is for a case where the input signal frequency $f_{in}$=1 [GHz], the input signal power $P_{in}$=−30 [dBm], $g_m$=20 [mS], $C_1$=50 [fF], and $C_2$=50 [fF] or 500 [fF]. FIG. 3 shows two results obtained for two respective values 50 [fF] and 500 [fF] for $C_2$ thereby changing the capacitance ratio between $C_1$ and $C_2$.

FIG. 3 indicates that the phase of the output signal changes depending on the capacitance ratio. As can be seen from FIG. 3, it is possible to adjust the phase of the output signal output from the phase shifter 100 by changing the capacitance ratio of $C_1$ to $C_2$.

Furthermore, FIG. 3 indicates that the amplitude changes depending on the capacitance ratio. That is, FIG. 3 indicates that if the phase of the output signal is changed, then a corresponding change in amplitude of the output signal occurs.

Note that it is assumed that the output from the phase shifter 100 is connected to an amplifier (for example, a power amplifier 17 shown in FIG. 1A). By adjusting the amplitude of the signal by the amplifier connected to the output of the phase shifter 100, the amplitude of the output signal may be corrected so as to cancel out the change that occurs in response to a change in the phase of the output signal. A variable gain amplifier may be used as the amplifier. Alternatively, the amplifier may be a digital amplifier configured to adjust the output level such that when the amplitude of the output signal is greater than a certain threshold value, the output signal is controlled at a fixed output level.

As described above, in the configuration according to the first embodiment, the phase shifter 100 includes the two voltage-to-current conversion circuits (110-1 and 110-2), the two capacitors (120-1 and 120-2), and the combining circuit 130. In the configuration shown in FIG. 2, it is possible to control the phase by controlling the capacitance values, $C_1$ and $C_2$, of two capacitors.

The phase shifter 100 according to the first embodiment has a simple configuration including no switch disposed in series in a signal path, which makes it possible to operate at a high speed to handle a wideband signal.

Furthermore, it is possible to achieve a small variation in capacitance ratio even in the CMOS configuration which is sensitive to a process variation, and/or variations of power supply voltage and temperature. Therefore, by using the phase shifter 100 according to the first embodiment in which the phase is controlled by the capacitance ratio, it is possible to achieve a phase control with a small deviation from a design value even when the phase shifter 100 is produced using the CMOS process. Thus, it is possible to reduce or simplify a calibration circuit that adjusts the variation from the design value, which makes it possible to reduce the size and/or consumption power of a wireless communication apparatus.

Second Embodiment

In a second embodiment described below, there is disclosed a continuous time (CT)/discrete time (DT) hybrid type phase shifter obtained by adding a charge sharing circuit to the phase shifter 100 according to the first embodiment described above. According to the second embodiment, the phase shifter also has the capability of controlling the phase using a control signal input to the charge sharing circuit in addition to the capability of controlling the phase by controlling the capacitance ratio.

Configurations of Transmission Apparatus and Reception Apparatus

Figure 4A:
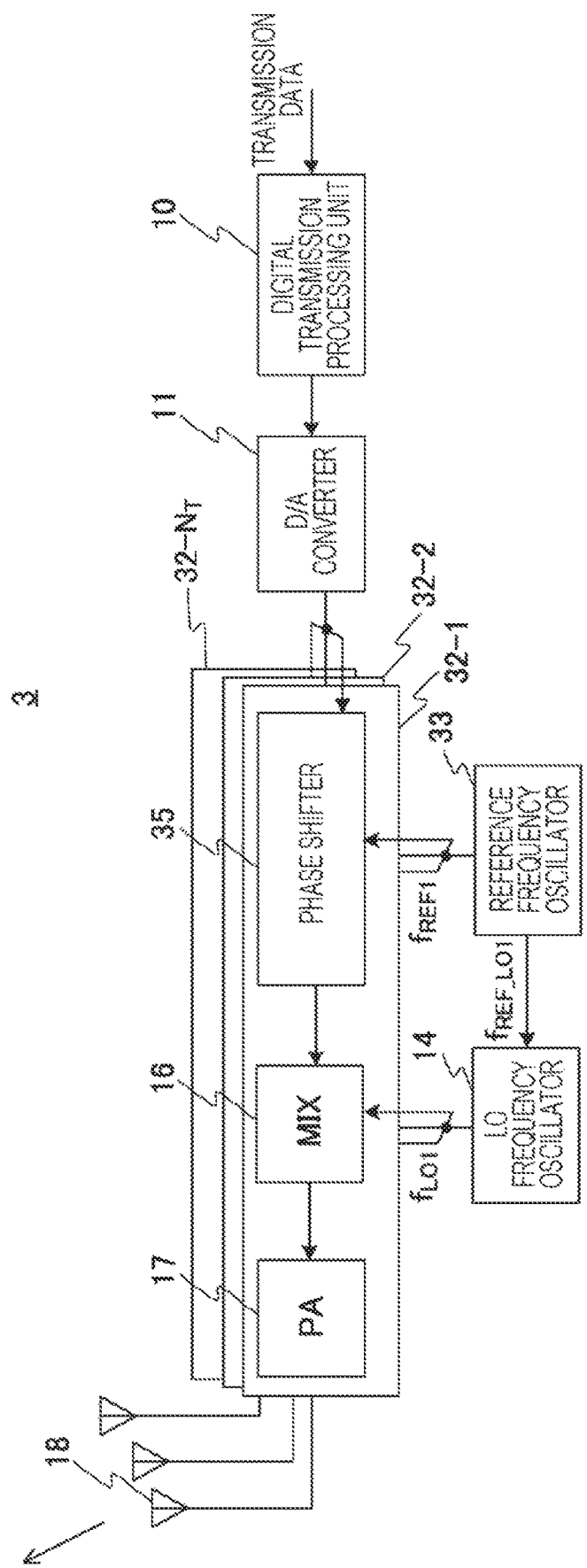
FIG. 4A is a diagram illustrating an example of a configuration of a transmission apparatus according to a second embodiment of the present disclosure.
Figure 4B:
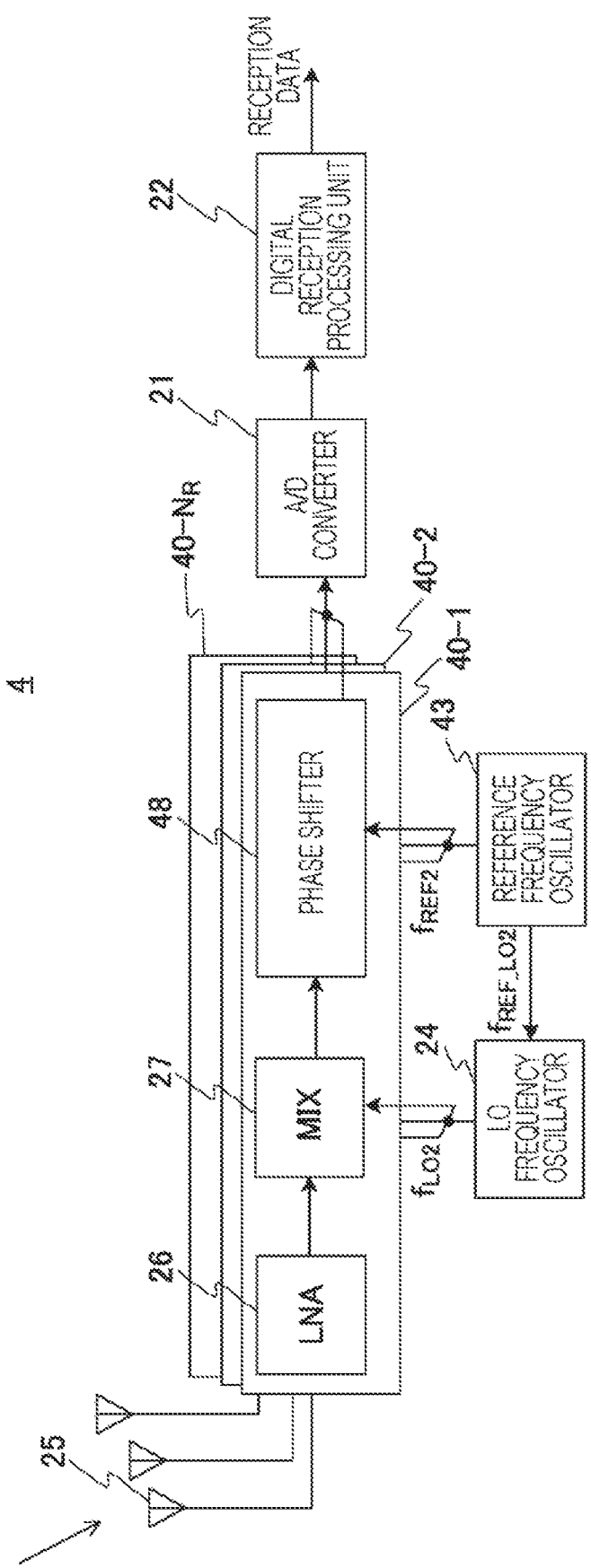
FIG. 4B is a diagram illustrating an example of a configuration of a reception apparatus according to the second embodiment of the present disclosure.

FIG. 4A is a diagram illustrating an example of a configuration of a transmission apparatus 3 according to the second embodiment of the present disclosure. FIG. 4B is a diagram illustrating an example of a configuration of a reception apparatus 4 according to the second embodiment of the present disclosure. Note that in the following description, expressions such as " ... er", " ... or" or the like used to indicate constituent elements of the transmission apparatus 3 or the reception apparatus 4 may be replaced by other expressions such as " ... circuitry", ... device", ... unit", ... module", or the like.

The transmission apparatus 3 shown in FIG. 4A includes, for example, a digital transmission processing unit 10, a D/A converter 11, $N_T$ analog transmission processing units 32 (analog transmission processing units 32-1 to 32-$N_T$), a reference frequency oscillator 33, and an LO frequency oscillator 14, where $N_T$ is an integer greater than or equal to 1.

The analog transmission processing units 32-1 to 32-$N_T$ have the same configuration, and thus the analog transmission processing unit 32-1 is taken as an example in the following description. The analog transmission processing unit 32-1 includes a phase shifter 35, a transmission mixer 16, a power amplifier 17, and an antenna 18.

The digital transmission processing unit 10 performs a predetermined digital transmission process including, for example, a coding process and a modulation process on transmission data thereby generating a baseband digital transmission signal, and the digital transmission processing unit 10 outputs the resultant baseband digital transmission signal to the D/A converter 11.

The D/A converter 11 converts the baseband digital transmission signal to a baseband analog transmission signal. The D/A converter 11 outputs the baseband analog transmission signal to the analog transmission processing units 32-1 to 32-$N_T$.

The reference frequency oscillator 33 generates a reference frequency signal $f_{REF1}$ used by the phase shifter 35, and outputs the resultant reference frequency signal $f_{REF1}$ to the phase shifter 35. The reference frequency oscillator 33 generates a reference frequency signal $f_{REF\_LO1}$ used in generating a local oscillation signal $f_{LO1}$ and outputs it to the LO frequency oscillator 14. The frequency of the reference frequency signal $f_{REF1}$ output to the phase shifter 35 and the frequency of the reference frequency signal $f_{REF\_LO1}$ output to the LO frequency oscillator 14 may be or may not be equal to each other.

The LO frequency oscillator 14 generates the local oscillation signal $f_{LO1}$ based on the reference frequency signal $f_{REF\_LO1}$, and outputs the resultant local oscillation signal $f_{LO1}$ to the transmission mixer 16.

The phase shifter 35 controls the phase of the baseband analog transmission signal using the reference frequency signal $f_{REF1}$. For example, the phase shifter 35 controls the phase of the baseband analog transmission signal to a phase corresponding to the direction of a beam formed by the transmission apparatus 3. The phase shifter 35 outputs the phase-controlled baseband analog transmission signal to the transmission mixer 16. The phase controlled by the phase shifter 35 is specified, for example, by a not-illustrated control unit.

Note that a configuration and an operation of the phase shifter 35 will be described later.

The transmission mixer 16 up-converts the phase-controlled baseband analog transmission signal to an RF frequency based on the local oscillation signal $f_{LO1}$, and outputs, to the power amplifier 17, the resultant analog transmission signal up-converted to the RF frequency.

The power amplifier 17 amplifies power of the analog transmission signal up-converted to the RF frequency, and outputs the resultant analog transmission signal to the antenna 18.

The antenna 18 radiates the power-amplified analog transmission signal.

The phase shifter 35 provided in each of the analog transmission processing units 32-1 to 32-$N_T$ controls the phase of the baseband analog transmission signal such that signals (beams) are controlled so as to be transmitted in desired directions from the antennas 18 of the respective analog transmission processing units 32-1 to 32-$N_T$.

The reception apparatus 4 shown in FIG. 4B includes, for example, $N_R$ analog reception processing units 40 (analog reception processing units 40-1 to 40-$N_R$), an A/D converter 21, a digital reception processing unit 22, a reference frequency oscillator 43, and an LO frequency oscillator 24, where $N_R$ is an integer greater than or equal to 1.

The analog reception processing units 40-1 to 40-$N_R$ have the same configuration, and thus the analog reception processing unit 40-1 is taken as an example in the following description. The analog reception processing unit 40-1 includes, for example, an antenna 25, a low noise amplifier 26, a reception mixer 27, and a phase shifter 48.

The antenna 25 receives an analog reception signal with an RF frequency from a not-illustrated transmission apparatus, and outputs the received analog reception signal to the low noise amplifier 26.

The low noise amplifier 26 amplifies the received RF-frequency analog reception signal, and outputs the received analog reception signal to the reception mixer 27.

The reference frequency oscillator 43 generates a reference frequency signal $f_{REF2}$ used by the phase shifter 48, and outputs the resultant reference frequency signal $f_{REF2}$ to the phase shifter 48. The reference frequency oscillator 43 generates a reference frequency signal $f_{REF\_LO2}$ used in generating a local oscillation signal $f_{LO2}$, and outputs the generated reference frequency signal $f_{REF\_LO2}$ to the LO frequency oscillator 24. The frequency of the reference frequency signal $f_{REF2}$ output to the phase shifter 48 and the frequency of the reference frequency signal $f_{REF\_LO2}$ output to the LO frequency oscillator 24 may be or may not be equal to each other.

The LO frequency oscillator 24 generates the local oscillation signal $f_{LO2}$ based on the reference frequency signal $f_{REF\_LO2}$, and outputs the generated local oscillation signal $f_{LO2}$ to the reception mixer 27.

The reception mixer 27 converts the RF-frequency analog reception signal to a baseband analog reception signal by performing a frequency conversion based on the local oscillation signal $f_{LO2}$, and outputs the resultant baseband analog reception signal to the phase shifter 48.

The phase shifter 48 controls the phase of the baseband analog transmission signal using the reference frequency signal $f_{REF2}$. For example, the phase shifter 48 controls the phase of the baseband analog reception signal to a phase corresponding to the direction of the beam formed by the reception apparatus 4. The phase shifter 48 outputs the phase-controlled baseband analog reception signal to the A/D converter 21. The phase controlled by the phase shifter 48 is specified, for example, by a not-illustrated control unit.

The A/D converter 21 combines the baseband analog reception signals that have been subjected to the phase control performed by the phase shifters 48 of the respective analog reception processing units 40-1 to 40-$N_R$. The A/D converter 21 converts the combined baseband analog reception signal to a baseband digital reception signal, and outputs the resultant baseband digital reception signal to the digital reception processing unit 22.

The digital reception processing unit 22 performs a predetermined digital reception process including, for example, a demodulation process and a decoding process and/or the like on the baseband digital reception signal thereby generating reception data, and outputs the resultant reception data.

The transmission apparatus 3 shown in FIG. 4A and the reception apparatus 4 shown in FIG. 4B each have a direct conversion configuration. In the transmission apparatus 3 or the reception apparatus 4 according to the second embodiment, one or more mixers may be added and a process at an intermediate frequency (IF) may be performed.

In a case where the transmission apparatus 3 shown in FIG. 4A and the reception apparatus 4 shown in FIG. 4B are included in one communication apparatus, two or more of the reference frequency signal $f_{REF\_LO1}$, the reference frequency signal $f_{REF\_LO2}$, the reference frequency signal $f_{REF1}$, and the reference frequency signal $f_{REF2}$ may be shared by both the transmission signal processing and the reception signal processing. That is, the reference frequency oscillator 33 and the reference frequency oscillator 43 may be shared by the transmission apparatus 3 and the reception apparatus 4, and/or the LO frequency oscillator 14 and the LO frequency oscillator 24 may be shared by the transmission apparatus 3 and the reception apparatus 4.

In the example of the transmission apparatus 3 shown in FIG. 4A, the phase shifter 35 is disposed between the D/A converter 11 and the transmission mixer 16. However, the present disclosure is not limited to this example. The phase shifter 35 may be disposed between the transmission mixer 16 and the power amplifier 17, or between the LO frequency oscillator 14 and the transmission mixer 16.

In a case where the phase shifter 35 is disposed between the transmission mixer 16 and the power amplifier 17, the phase shifter 35 controls the phase of the analog transmission signal having been subjected to the up-conversion to the RF frequency.

In a case where the phase shifter 35 is disposed between the LO frequency oscillator 14 and the transmission mixer 16, the phase shifter 35 controls the phase of the local oscillation signal $f_{LO1}$. By controlling the phase of the local oscillation signal $f_{LO1}$, the phase of the analog transmission signal which is up-converted by the transmission mixer 16 based on the local oscillation signal $f_{LO1}$ is indirectly controlled.

In the example of the reception apparatus 4 shown in FIG. 4B, the phase shifter 48 is disposed between the reception mixer 27 and the A/D converter 21. However, the present disclosure is not limited to this example. The phase shifter 48 may be disposed between the low noise amplifier 26 and the reception mixer 27, or between the LO frequency oscillator 24 and the reception mixer 27.

In a case where the phase shifter 48 is disposed between the low noise amplifier 26 and the reception mixer 27, the phase shifter 48 controls the phase of the RF-frequency analog reception signal.

In a case where the phase shifter 48 is disposed between the LO frequency oscillator 24 and the reception mixer 27, the phase shifter 48 controls the phase of the local oscillation signal $f_{LO2}$. By controlling the phase of the local oscillation signal $f_{LO2}$, the phase of the analog reception signal which is down-converted by the reception mixer 27 based on the local oscillation signal $f_{LO2}$ is indirectly controlled.

The phase shifter 35 and/or the phase shifter 48 may be a variable gain amplifier having a gain control function, or a function of a filter and/or a function of an equalizer may be added to the phase shifter 35 and/or the phase shifter 48. For example, the configuration of the phase shifter 35 and/or the phase shifter 48 may be changed to add at least one of functions including the gain control function, the filter function, and the equalizer function. Alternatively, to add the gain control function, a variable gain amplifier may be added. To add the filter function, a filter may be added. To add the equalizer function, an equalizer may be added.

Configuration and Operation of Phase Shifter 200

Next, referring to FIG. 5, an example of a configuration of the phase shifter 200 according to the second embodiment is described below. The phase shifter 200 described below corresponds to the phase shifter 35 shown in FIG. 4A and/or the phase shifter 48 shown in FIG. 4B.

Figure 5:
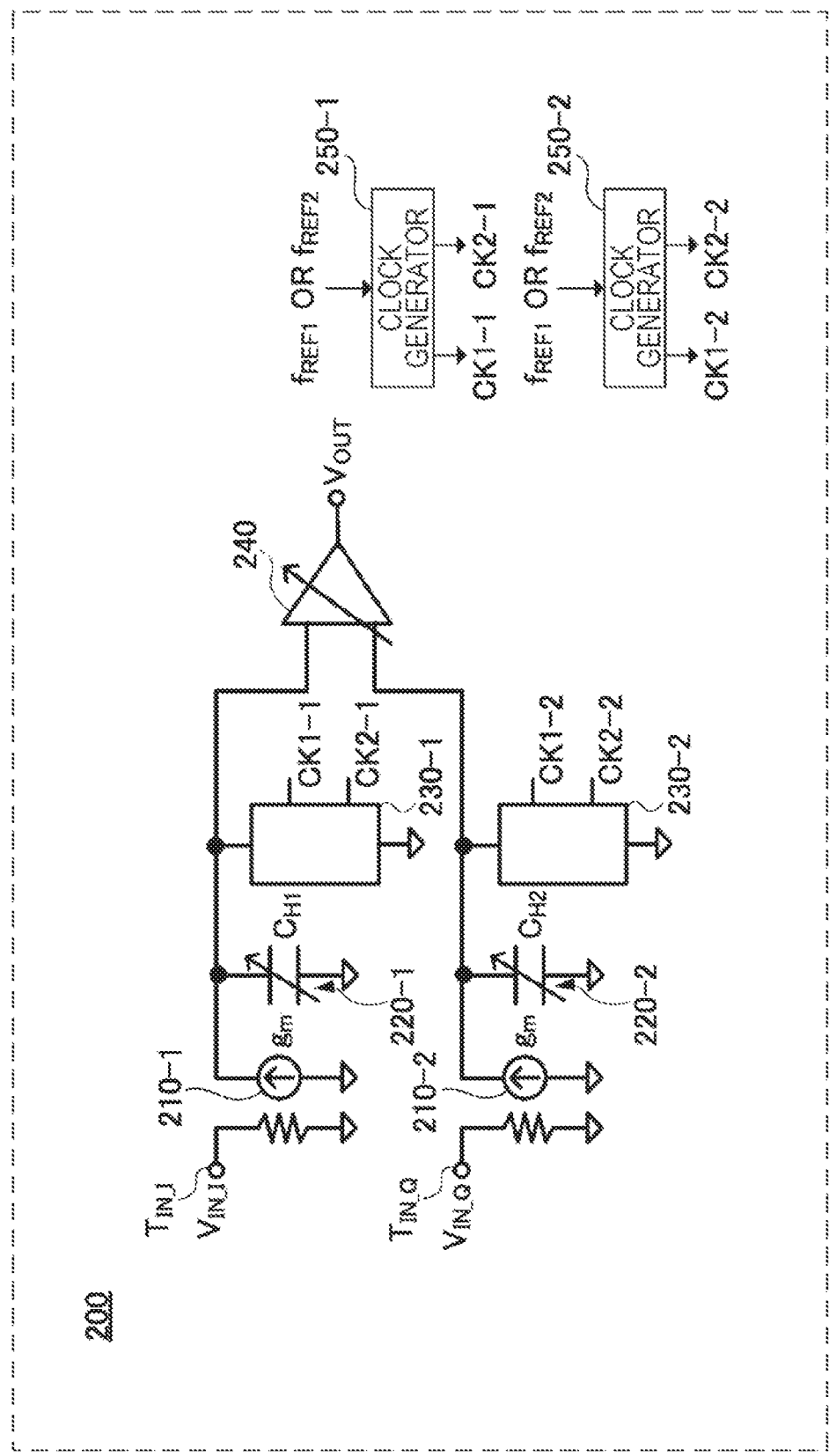
FIG. 5 is a diagram illustrating an example of a configuration of a phase shifter according to the second embodiment of the present disclosure.

FIG. 5 is a diagram illustrating an example of a configuration of the phase shifter 200 according to the second embodiment. The phase shifter 200 shown in FIG. 5 includes, for example, a TA 210-1, a TA 210-2, a capacitor 220-1, a capacitor 220-2, a charge sharing circuit 230-1, a charge sharing circuit 230-2, a combining circuit 240, a clock generator 250-1, and a clock generator 250-2.

The TA 210-1, the TA 210-2, the capacitor 220-1, the capacitor 220-2, and the combining circuit 240 shown in FIG. 5 are respectively similar to the TA 110-1, the TA 110-2, the capacitor 120-1, the capacitor 120-2, and the combining circuit 130 shown in FIG. 2. The capacitance value of the capacitor 220-1 and the capacitance value of the capacitor 220-2 are respectively $C_{H1}$ and $C_{H2}$.

The clock generator 250-1 generates a control signal CK1-1 and a control signal CK2-1 using the reference frequency signal $f_{REF1}$ output from the reference frequency oscillator 33 (see FIG. 4A) or the reference frequency signal $f_{REF2}$ output from the reference frequency oscillator 43 (see FIG. 4B), and the clock generator 250-1 outputs them to the charge sharing circuit 230-1.

The clock generator 250-2 generates a control signal CK1-2 and a control signal CK2-2 using the reference frequency signal $f_{REF1}$ output from the reference frequency oscillator 33 (see FIG. 4A) or the reference frequency signal $f_{REF2}$ output from the reference frequency oscillator 43 (see FIG. 4B), and the clock generator 250-2 outputs them to the charge sharing circuit 230-2.

One of electrodes of the charge sharing circuit 230-1 is connected to the output of the TA 210-1, and the other one of the electrodes is connected to GND (that is, grounded). The charge sharing circuit 230-1 is input with the control signal CK1-1 and the control signal CK2-1 generated by the clock generator 250-1. Note that one of the control signal CK1-1 and the control signal CK2-1 may be input to the charge sharing circuit 230-1.

One of electrodes of the charge sharing circuit 230-2 is connected to the output of the TA 210-2, and the other one of the electrodes is connected to GND (that is, grounded). The charge sharing circuit 230-2 is input with the control signal CK1-2 and the control signal CK2-2 generated by the clock generator 250-2. Note that one of the control signal CK1-2 and the control signal CK2-2 may be input to the charge sharing circuit 230-2.

Note that a system that includes the TA 210-1, the capacitor 220-1, and the charge sharing circuit 230-1 shown in FIG. 5 and that operates to handle an input signal $V_{IN\_I}$ may be called an I-circuit. On the other hand, a system that includes the TA 210-2, the capacitor 220-2, and the charge sharing circuit 230-2 shown in FIG. 5 and that operates to handle an input signal $V_{IN\_Q}$ may be called a Q-circuit.

Note that the charge sharing circuit 230-1 and the charge sharing circuit 230-2 may be generically referred to as a charge sharing circuit 230. The clock generator 250-1 and the clock generator 250-2 may be generically referred to as a clock generator 250. The control signal CK1-1 and the control signal CK1-2 may be generically referred to as a control signal CK1. The control signal CK2-1 and the control signal CK2-2 may be generically referred to as a control signal CK2.

Next, an example of the charge sharing circuit 230 and examples of the control signal CK1 and the control signal CK2 output from the clock generator 250 are described below.

Figure 6A:
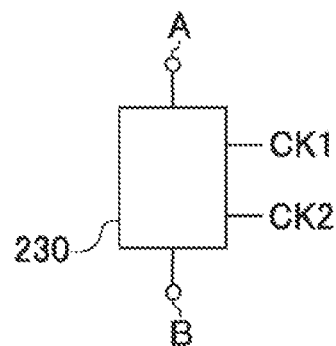
FIG. 6A is a diagram illustrating a charge sharing circuit according to the second embodiment of the present disclosure.

FIG. 6A is a diagram illustrating the charge sharing circuit 230 according to the second embodiment. The charge sharing circuit 230 shown in FIG. 6A includes, for example, a connection terminal A and a connection terminal B. The charge sharing circuit 230 is input with the control signal CK1 and the control signal CK2 generated by the clock generator 250. Note that the control signal each may be called a clock. In FIG. 6A, by way of example, the control signal CK1 and the control signal CK2 are input to the charge sharing circuit 230. However, one of the control signal CK1 and the control signal CK2 may be input to the charge sharing circuit 230.

Figure 6B:
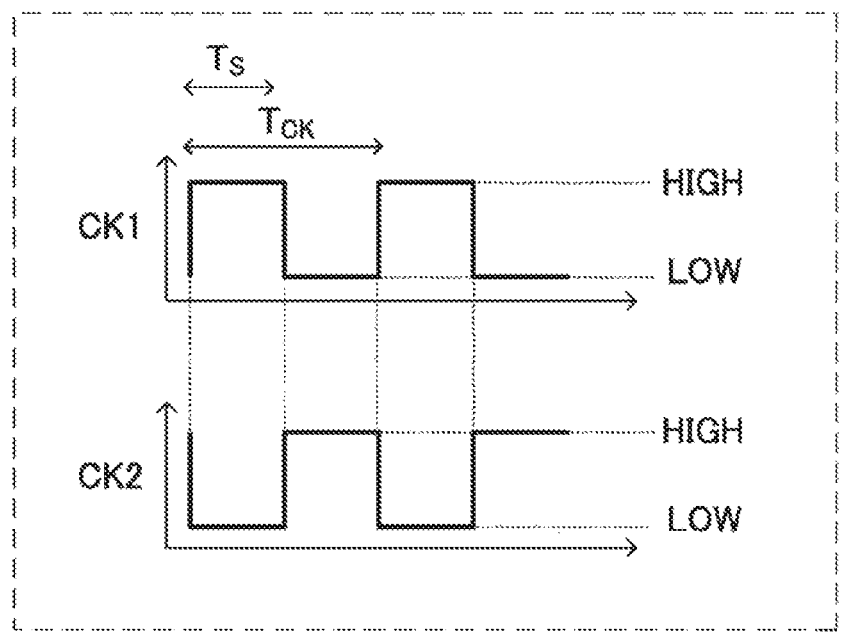
FIG. 6B is a diagram illustrating an example of a control signal input to the charge sharing circuit shown by way of example in FIG. 6A.

FIG. 6B is a diagram illustrating an example of a control signal input to the charge sharing circuit 230 illustrated by way of example in FIG. 6A. In FIG. 6B, a horizontal axis represents time and a vertical axis represents an amplitude. The duty ratio (=pulse width Ts/repetition period $T_{CK}$ of control signal) is 1/2 for both the control signal CK1 and the control signal CK2. The control signal CK2 is a signal with a phase different by 180° with respect to the phase of the control signal CK1. The clock frequency $f_{CK}$ ($f_{CK}=1/T_{CK}$) of each of the control signal CK1 and the control signal CK2 may be or may not be equal to the frequency of the reference frequency signal ($f_{REF}$).

In the following description, a time period in which the control signal CK1 is at a "high" level shown in FIG. 6B may be referred to as a high level period of the control signal CK1, and a time period in which the control signal CK1 is at a "low" level shown in FIG. 6B may be referred to as a low level period of the control signal CK1. Similarly, a time period in which the control signal CK2 is at a "high" level and a time period in which the control signal CK2 is at a "low" level may be respectively referred to as a high level period and a low level period of the control signal CK2.

First Example of Charge Sharing Circuit 230

Figure 7A:
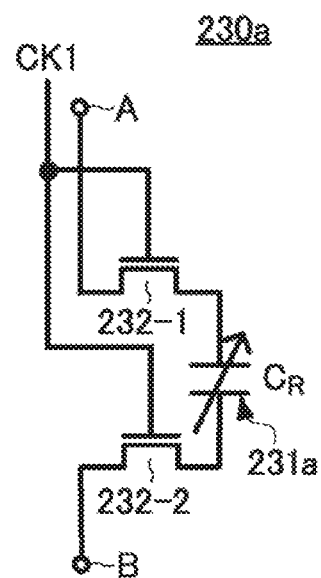
FIG. 7A is a diagram illustrating a first example of a charge sharing circuit according to the second embodiment of the present disclosure.

FIG. 7A is a diagram illustrating a first example of the charge sharing circuit 230 according to the second embodiment. The charge sharing circuit 230a shown in FIG. 7A includes, for example, a capacitor 231a, a switch 232-1, and a switch 232-2.

A capacitor 231a is a variable capacitor capable of adjusting its capacitance value. The capacitance value of the capacitor 231a is denoted as $C_R$.

The switch 232-1 is disposed between an electrode A and one of electrodes of the capacitor 231a. The switch 232-2 is disposed between an electrode B and the other one of electrodes of the capacitor 231a.

The turning-on and the turning-off of the switch 232-1 and the switch 232-2 are controlled by the control signal CK1. For example, the switch 232-1 and the switch 232-2 are in an on-state when the control signal CK1 is in the high level period, while the switch 232-1 and the switch 232-2 are in an off-state when the control signal CK1 is in any period other than the high level period.

Also in the following description, switches are in the on-state when the control signal is in the high level period, while switches are in the off-state when the control signal is in any period other than the high level period.

For example, when the control signal CK1 is in the high level period, the switch 232-1 connects the terminal A to the one of terminals of the capacitor 231a. The switch 232-2 connects the terminal B to the other one of the terminals of the capacitor 231a when the control signal CK1 is in the high level period. When the control signal CK1 is in any period other than the high level period, the switch 232-1 and the switch 232-2 are in the off-state and thus the connections are opened.

In the charge sharing circuit 230a, when the control signal CK1 is in the high level period, the capacitor 231a is connected to the terminal A and the terminal B, while when the control signal CK1 is in the low level period, the connections of the capacitor 231a are opened.

Next, an example of an operation of the phase shifter 200 shown in FIG. 5 is described below for a case where the charge sharing circuit 230a shown in FIG. 7A is used as the charge sharing circuit 230-1 and the charge sharing circuit 230-2 in FIG. 5.

Note that in a case where the charge sharing circuit 230a is used as the charge sharing circuit 230-1, the capacitor 231a may be called a capacitor 231a-1, while in a case where the charge sharing circuit 230a is used as the charge sharing circuit 230-2, the capacitor 231a may be called a capacitor 231a-2.

When the control signal CK1 is in the high level period, a charge output from the TA 210-1 is accumulated in both the capacitor 220-1 and the capacitor 231a-1. When the control signal CK1 is in the low level period, a charge output from the TA 210-1 is accumulated in the capacitor 220-1.

Similarly, when the control signal CK1 is in the high level period, a charge output from the TA 210-2 is accumulated in both the capacitor 220-2 and the capacitor 231a-2, while when the control signal CK1 is in the low level period, a charge output from the TA 210-2 is accumulated in the capacitor 220-2.

Second Example of Charge Sharing Circuit 230

Figure 7B:
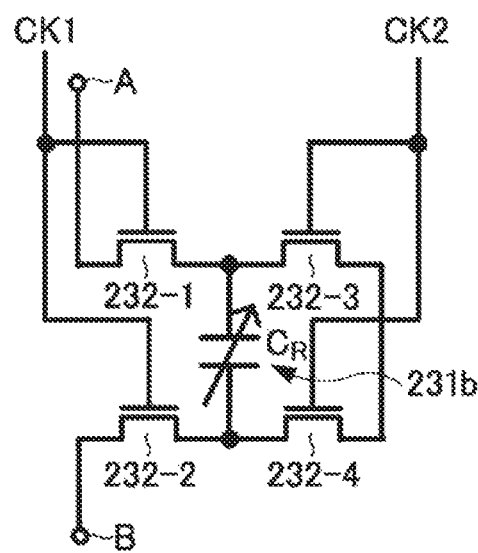
FIG. 7B is a diagram illustrating a second example of a charge sharing circuit according to the second embodiment of the present disclosure.

FIG. 7B is a diagram illustrating a second example of the charge sharing circuit 230 according to the second embodiment. The charge sharing circuit 230*b* shown in FIG. 7B includes, for example, a capacitor 231*b*, and switches 232-1 to 232-4.

The capacitor 231*b* is a variable capacitor capable of adjusting its capacitance value. The capacitance value of the capacitor 231*b* is denoted as $C_R$.

The switch 232-1 is disposed between an electrode A and one of electrodes of the capacitor 231*b*. The switch 232-2 is disposed between an electrode B and the other one of the electrodes of the capacitor 231*b*. The switch 232-3 and the switch 232-4 are disposed between one of the electrodes of the capacitor 231*b* and the other one of the electrodes.

The turning-on and the turning-off of the switch 232-1 and the 232-2 are controlled by the control signal CK1. The turning-on and the turning-off of the switches 232-3 and 232-4 are controlled by the control signal CK2.

For example, when the control signal CK1 is in the high level period, the switch 232-1 connects the terminal A to the one of terminals of the capacitor 231, while the switch 232-2 connects the terminal B to the other one of the terminals of the capacitor 231*b* when the control signal CK1 is in the high level period. When the control signal CK1 is in any period other than the high level period, the switch 232-1 and the switch 232-2 are in the off-state and thus the connections are opened.

For example, when the control signal CK2 is in the high level period, the switch 232-3 and the switch 232-4 connect one of terminals of the capacitor 231*b* to the other one of the terminals. When the control signal CK2 is in any period other than the high level period, the switch 232-3 and the switch 232-4 are in the off-state and thus the connections are opened.

In the case of a configuration in which one of electrodes of the capacitor 231*b* is connected to the other one of electrodes when the control signal CK2 is in the high level period, for example, one of the switch 232-3 and the switch 232-4 may be removed.

As shown in FIG. 6B, the control signal CK1 and the control signal CK2 are different in phase from each other by 180°. Therefore, when the control signal CK1 is in the high level period, the control signal CK2 is in the low level period, while when the control signal CK1 is in the low level period, the control signal CK2 is in the high level period.

In the charge sharing circuit 230*b*, when the control signal CK1 is in the high level period, the capacitor 231*b* is connected to the terminal A and the terminal B, while when the control signal CK1 is in the low level period, one of terminals of the capacitor 231*b* is connected to the other one of the terminals. The connecting one of the electrodes of the capacitor 231*b* to the other one of the electrodes causes the two terminals of the capacitor 231*b* to be equal in potential to each other, and thus the charge stored in the capacitor 231*b* is discharged.

Next, an example of an operation of the phase shifter 200 shown in FIG. 5 is described below for a case where the charge sharing circuit 230*b* shown in FIG. 7B is used as the charge sharing circuit 230-1 and the charge sharing circuit 230-2 shown in FIG. 5.

Note that in a case where the charge sharing circuit 230*b* is used as the charge sharing circuit 230-1, the capacitor 231*b* may be called a capacitor 231*b*-1, while in a case where the charge sharing circuit 230*b* is used as the charge sharing circuit 230-2, the capacitor 231*b* may be called a capacitor 231*b*-2.

When the control signal CK1 is in the high level period, a charge output from the TA 210-1 is accumulated in both the capacitor 220-1 and the capacitor 231*b*-1. When the control signal CK1 is in the low level period, a charge output from the TA 210-1 is accumulated in the capacitor 220-1. When the control signal CK1 is in the low level period (the control signal CK2 is in the high level period), the charge stored in the capacitor 231*b*-1 is discharged.

Similarly, when the control signal CK1 is in the high level period, a charge output from the TA 210-2 is accumulated in both the capacitor 220-2 and the capacitor 231*b*-2, while when the control signal CK1 is in the low level period, a charge output from the TA 210-2 is accumulated in the capacitor 220-2. When the control signal CK1 is in the low level period (the control signal CK2 is in the high level period), the charge accumulated in the capacitor 231*b*-2 is discharged.

Differences Between FIG. 7A and FIG. 7B

The configuration shown in FIG. 7A and the configuration shown in FIG. 7B are different from each other in terms of complexity and the degree of gain control range, which provides a freedom of selection of the configuration. In the charge sharing circuit 230*a* shown in FIG. 7A, when the control signal CK1 is in the low level period, a charge is retained in the capacitor 231*a*. In the charge sharing circuit 230*b* shown in FIG. 7B, when the control signal CK1 is in the low level period, the control signal CK2 is in the high level period, and thus the charge in the capacitor 231*b* is discharged.

In a case where the charge sharing circuit 230*a* shown in FIG. 7A is used as the charge sharing circuit 230-1 in FIG. 5, a transfer function of an I-circuit including the TA 210-1, the capacitor 220-1, and the charge sharing circuit 230-1 shown in FIG. 5 is given by equation (5).

$$H_{CD} = \frac{g_m}{j\omega(C_H + C_R)}\left\{1 - \frac{K_1(1-z^{-1})^2}{j\omega T_S D_1}\right\} \quad (5)$$

In equation (5), $C_H$ denotes a capacitance value ($C_{H1}$) of the capacitor 220-1, and $C_R$ denotes a capacitance value of the capacitor 231*a*-1 for a case where the charge sharing circuit 230*a* is used as the charge sharing circuit 230-1. The pulse width $T_S$ is determined by the clock frequency of the control signals CK1-1 and CK2-1. $D_1$ is given by equation (6).

$$D_1 = 1 - K_0 z^{-1} - K_1 z^{-2} \quad (6)$$

$K_0$ in equation (6) is given by equation (7).

$$K_0 = \frac{C_H}{C_H + C_R} \quad (7)$$

$K_1$ in equation (5) and equation (6) is given by equation (8).

$$K_1 = \frac{C_R}{C_H + C_R} \quad (8)$$

Similarly, a transfer function of a Q-circuit including the TA 210-2, the capacitor 220-2, and the charge sharing circuit 230-2 shown in FIG. 5 is given by equation (5). In the transfer function of the Q-circuit, $C_H$ in equation (5) is given by a capacitance value $C_{H2}$ of the capacitor 220-2, and $C_R$ is given by a capacitance value of the capacitor 231*a*-2 for a case where the charge sharing circuit 230a is employed as the charge sharing circuit 230-2.

The clock frequency of the control signal CK1-1 input to the charge sharing circuit 230-1 and the clock frequency of the control signal CK2-1 input to the charge sharing circuit 230-2 may be or may not be equal to each other. The duty ratio of the control signal CK1-1 input to the charge sharing circuit 230-1 and the duty ratio of the control signal CK2-1 input to the charge sharing circuit 230-2 may be or may not be equal to each other.

Equation (5) indicates that the gain of the circuit represented by the transfer function is determined by the clock frequency and the capacitance ratio, which means that it is possible to control the phase of the phase shifter 200 shown in FIG. 5 by using at least one of the clock frequency and the capacitance ratio.

It also can be seen that in a case where the charge sharing circuit 230b shown in FIG. 7B is employed as the charge sharing circuit 230-1 and the charge sharing circuit 230-2 shown in FIG. 5, the gains of the I-circuit and the Q-circuit are determined by the clock frequency and the capacitance ratio. Thus, it is possible to control the phase of the phase shifter 200 shown in FIG. 5 by using at least one of the clock frequency and the capacitance ratio.

Method of Controlling Phase

In a case where the charge sharing circuit 230a shown in FIG. 7A is used in the phase shifter 200, and also in a case where the charge sharing circuit 230b shown in FIG. 7B is used in the phase shifter 200, it is possible to give a difference (a gain difference) between the gain of the I-circuit and the gain of the Q-circuit by executing at least one of control methods (2-1) to (2-3) described by way of example below thereby controlling the phase of the output signal output from the combining circuit 240.

Control Method (2-1)

Adjust the capacitance value of the capacitor 220-1 and the capacitance value of the capacitor 220-2.

Control Method (2-2)

Adjust the capacitance ratio between the capacitor 220-1 and the capacitor 231-1 of the charge sharing circuit 230-1, and the capacitance ratio between the capacitor 220-2 and the capacitor 231-2 of the charge sharing circuit 230-2.

Control Method (2-3)

Adjust the clock frequency of control signals input to the charge sharing circuit 230-1 and the charge sharing circuit 230-2.

It is possible to control the phase of the output signal using at least one of the control methods (2-1) to (2-3) described above.

Next, a phase control characteristic of the phase shifter 200 is described.

Figure 8:
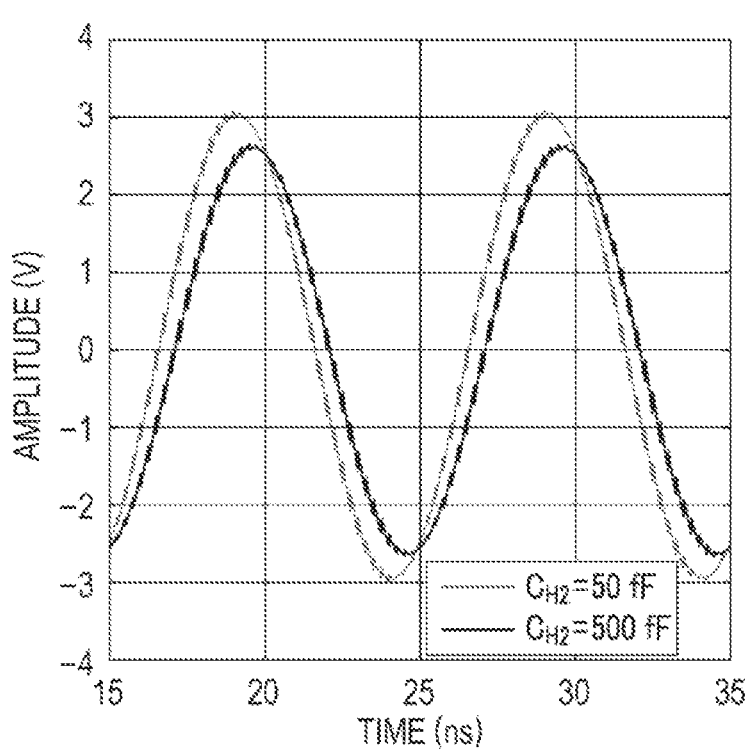
FIG. 8 is a diagram illustrating an example of a result of simulation of an output waveform output from a phase shifter according to the second embodiment of the present disclosure.

FIG. 8 is a diagram illustrating an example of a result of simulation of an output waveform output from the phase shifter 200 according to the second embodiment. In FIG. 8, a horizontal axis represents time and a vertical axis represents an output voltage.

The result of the simulation shown in FIG. 8 is for a case where the input signal frequency $f_{in}$=0.1 [GHz], the input signal power $P_{in}$=−30 [dBm], $g_m$=20 [mS], $C_R$=100 [fF], $C_{H1}$=50 [fF], and $C_{H2}$=50 [fF] or 500 [fF]. FIG. 8 shows two results obtained for two respective values of $C_{H2}$, 50 [fF] and 500 [fF], while maintaining $C_{H1}$ at a fixed value of 50 [fF] thereby changing the capacitance ratio between $C_{H1}$ and $C_{H2}$.

FIG. 8 indicates that the phase of the output signal changes depending on the capacitance ratio. As can be seen from FIG. 8, the phase shifter 200 is capable of adjusting the phase of the output signal by changing the capacitance ratio of $C_{H1}$ to $C_{H2}$.

Furthermore, FIG. 8 indicates that the amplitude changes depending on the capacitance ratio. That is, FIG. 8 indicates that if the phase of the output signal is adjusted, then a corresponding change in amplitude of the output signal occurs.

Note that it is assumed that the output from the phase shifter 200 is connected to an amplifier (for example, the power amplifier 17 shown in FIG. 4A). By adjusting the amplitude of the signal by the amplifier connected to the output of the phase shifter 200, the amplitude of the output signal may be corrected so as to cancel out the change that occurs in response to a change in the phase of the output signal. A variable gain amplifier may be used as the amplifier. Alternatively, the amplifier may be a digital amplifier configured to adjust the output level such that when the amplitude of the output signal is greater than a certain threshold value, the output signal is controlled at a fixed output level.

In the second embodiment, the configuration is explained for the phase shifter 200 including the two voltage-to-current conversion circuits (210-1 and 210-2), the two capacitors (220-1 and 220-2), the two charge sharing circuits (230-1 and 230-2), the combining circuit 240 and the clock generator 250. In the configuration shown in FIG. 5, it is possible to control the phase by controlling the capacitance ratio and/or a parameter (for example, the clock frequency) associated with the control signal.

The phase shifter 200 according to the second embodiment has a simple configuration in which there are only a small number of switches and there is no switch disposed in series in a signal path, which makes it possible to operate at a high speed to handle a wideband signal.

Furthermore, it is possible to achieve a small variation in capacitance ratio even in the CMOS configuration which is sensitive to a process variation, and/or variations of power supply voltage and temperature. Therefore, by using the phase shifter 200 according to the second embodiment in which the phase is controlled by the clock frequency or the capacitance ratio, it is possible to achieve a phase control with a small deviation from a design value when the phase shifter 200 is produced using the CMOS process. Thus, it is possible to reduce or simplify a calibration circuit that adjusts the variation from the design value, which makes it possible to reduce the size and/or consumption power of a wireless communication apparatus.

In the second embodiment, by way of example, a variable capacitor is employed as the capacitor 231a of the charge sharing circuit 230a and also as the capacitor 231b of the charge sharing circuit 230b. However, the present disclosure is not limited to this example. For example, in a case where the charge sharing circuit 230a is used as the charge sharing circuit 230-1 and the charge sharing circuit 230-2 shown in FIG. 5, the capacitor 231a of one of the charge sharing circuit 230-1 and the charge sharing circuit 230-2 may be a variable capacitor, and the capacitor 231a of the other one may be a capacitor with a fixed capacitance value. In this case, the capacitance ratio may be adjusted by adjusting the capacitance value of the variable capacitor.

Third Embodiment

In a third embodiment described below, an equalizer function is added to the phase shifter 200 according to the second embodiment thereby achieving a phase shifter having a wide frequency characteristic.

The transmission apparatus and the reception apparatus according to the third embodiment are similar, in configuration, to the transmission apparatus 3 shown in FIG. 4A and the reception apparatus 4 shown in FIG. 4B, and thus a further description thereof is omitted. The phase shifter according to the fourth embodiment corresponds to, for example, the phase shifter 35 shown in FIG. 4A or the phase shifter 48 shown in FIG. 4B. Note that in the following description, expressions such as " . . . er", " . . . or" or the like used to indicate constituent elements of the transmission apparatus 3 or the reception apparatus 4 may be replaced by other expressions such as " . . . circuitry", . . . device", . . . unit", . . . module", or the like.

Configuration and Operation of Phase Shifter 300

Figure 9:
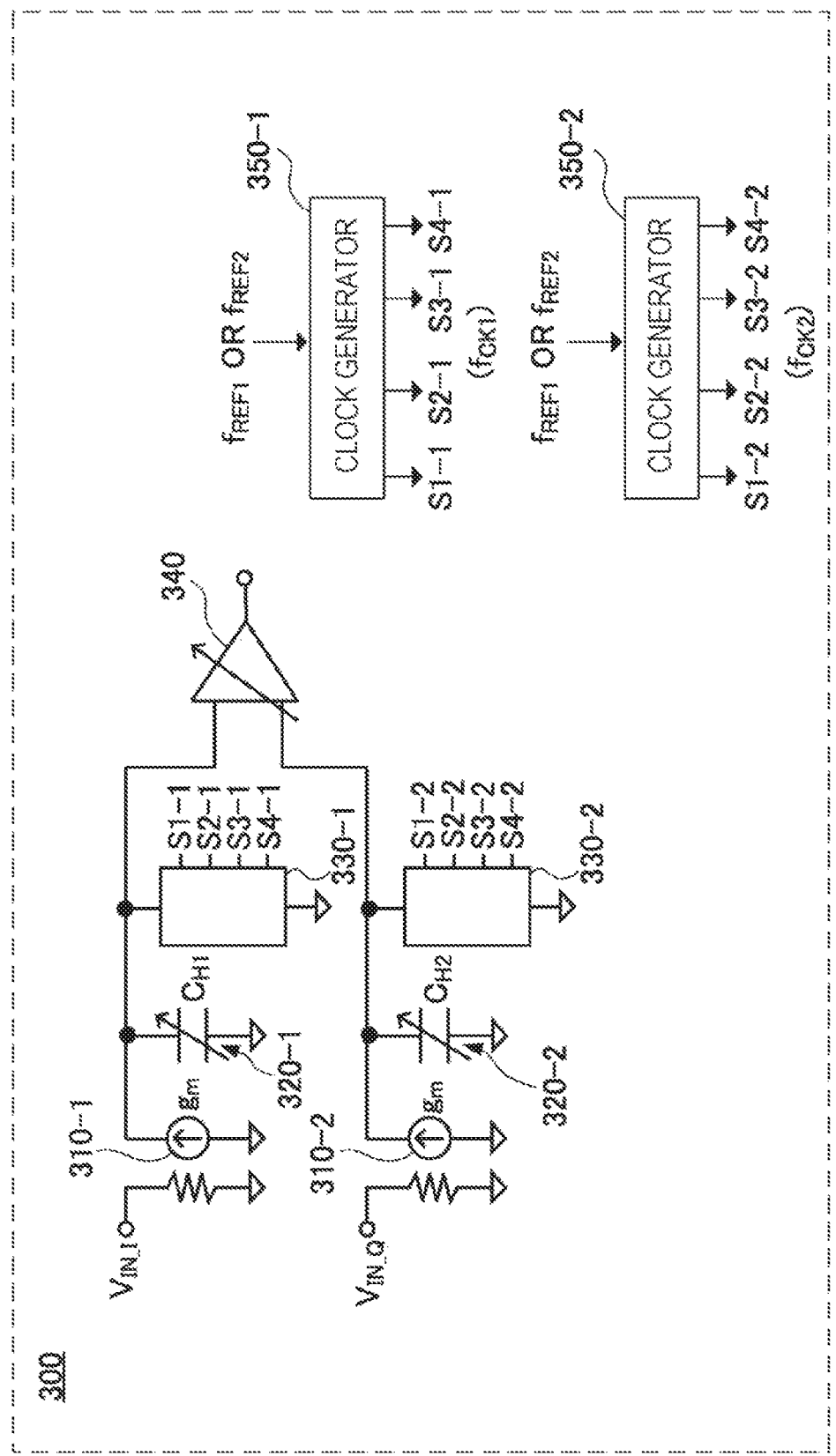
FIG. 9 is a diagram illustrating an example of a configuration of a phase shifter according to a third embodiment of the present disclosure.

FIG. 9 is a diagram illustrating an example of a configuration of a phase shifter 300 according to the third embodiment. The phase shifter 300 shown in FIG. 9 includes, for example, a TA 310-1, a TA 310-2, a capacitor 320-1, a capacitor 320-2, a charge sharing circuit 330-1, a charge sharing circuit 330-2, a combining circuit 340, a clock generator 350-1, and a clock generator 350-2.

The TA 310-1, the TA 310-2, the capacitor 320-1, the capacitor 320-2, and the combining circuit 340 shown in FIG. 9 are respectively similar to the TA 110-1, the TA 110-2, the capacitor 120-1, the capacitor 120-2, and the combining circuit 130 shown in FIG. 2. The capacitance value of the capacitor 320-1 and the capacitance value of the capacitor 320-2 are respectively $C_{H1}$ and $C_{H2}$.

The clock generator 350-1 generates control signals S1-1, S2-1, S3-1, and S4-1 using a reference frequency signal $f_{REF1}$ output from a reference frequency oscillator 33 (refer to FIG. 4A) or a reference frequency signal $f_{REF2}$ output from a reference frequency oscillator 43 (refer to FIG. 4B), and outputs them to the charge sharing circuit 330-1. The clock frequency of the control signals S1-1, S2-1, S3-1, and S4-1 is, for example, $f_{CK1}$.

The clock generator 350-2 generates control signals S1-2, S2-2, S3-2, and S4-2 using a reference frequency signal $f_{REF1}$ output from a reference frequency oscillator 33 (refer to FIG. 4A) or a reference frequency signal $f_{REF2}$ output from a reference frequency oscillator 43 (refer to FIG. 4B), and outputs them to the charge sharing circuit 330-2. The clock frequency of the control signals S1-2, S2-2, S3-2, and S4-2 is, for example, $f_{CK2}$.

One of electrodes of the charge sharing circuit 330-1 is connected to the output of the TA 310-1, and the other one of electrodes is connected to GND (that is, grounded). The charge sharing circuit 330-1 is input with a control signal generated by the clock generator 350-1.

One of electrodes of the charge sharing circuit 330-2 is connected to the output of the TA 310-2, and the other one of the electrodes is connected to GND (that is, grounded). The charge sharing circuit 330-2 is input with a control signal generated by the clock generator 350-2.

Note that a system that includes the TA 310-1, the capacitor 320-1, and the charge sharing circuit 330-1 shown in FIG. 9 and that operates to handle an input signal $V_{IN\_I}$ may be called an I-circuit, while a system that includes the TA 310-2, the capacitor 320-2, and the charge sharing circuit 330-2 shown in FIG. 9 and that operates to handle an input signal $V_{IN\_Q}$ may be called a Q-circuit.

Note that the charge sharing circuit 330-1 and the charge sharing circuit 330-2 may be generically referred to as a charge sharing circuit 330. The clock generator 350-1 and the clock generator 350-2 may be generically referred to as a clock generator 350. The control signal S1-1 and the control signal S1-2 may be generically referred to as a control signal S1. The other control signals may be generically referred in a similar manner.

Next, an example of the charge sharing circuit 330 and examples of the control signals S1, S2, S3, and S4 output from the clock generator 350 are described below.

Figure 10A:
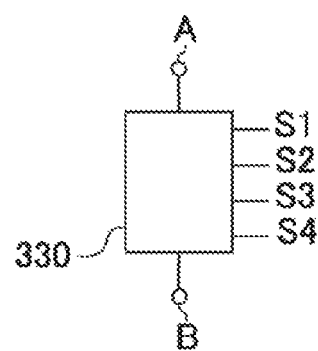
FIG. 10A is a diagram illustrating a charge sharing circuit according to the third embodiment of the present disclosure.

FIG. 10A is a diagram illustrating the charge sharing circuit 330 according to the third embodiment. The charge sharing circuit 330 shown in FIG. 10A includes, for example, a connection terminal A and a connection terminal B. The charge sharing circuit 330 is input with the control signals S1 to S4 generated by the clock generator 350. Note that the control signals each may also be called a clock.

Figure 10B:
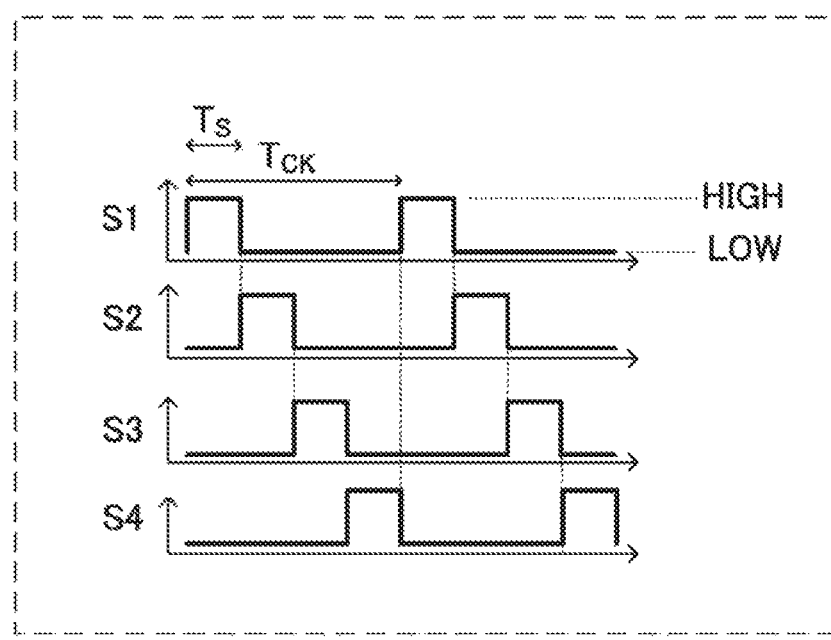
FIG. 10B is a diagram illustrating an example of a control signal input to the charge sharing circuit illustrated by way of example in FIG. 10A.

FIG. 10B is a diagram illustrating an example of each of control signals input to the charge sharing circuit 330 illustrated by way of example in FIG. 10A. In FIG. 10B, a horizontal axis represents time and a vertical axis represents an amplitude. The duty ratio of each of the control signals S1 to S4 is 1/4. The control signal S2 is a signal with a phase different by 90° with respect to the phase of the control signal S1. The control signal S3 is a signal with a phase different by 180° with respect to the phase of the control signal S1. The control signal S4 is a signal with a phase different by 270° with respect to the phase of the control signal S1. The clock frequency $f_{CK}(f_{CK}=1/T_{CK})$ of each of the control signals S1 to S2 may be or may not be equal to the frequency of the reference frequency signal ($f_{REF}$).

In the following description, a time period in which the control signal S1 is at a "high" level shown in FIG. 10B may be referred to as a high level period of the control signal S1, while a time period in which the control signal S1 is at a "low" level shown in FIG. 10B may be referred to as a low level period of the control signal S1. High and low level periods may be defined in a similar manner also for the control signals S2 to S4.

Example of Charge Sharing Circuit 330

Figure 11:
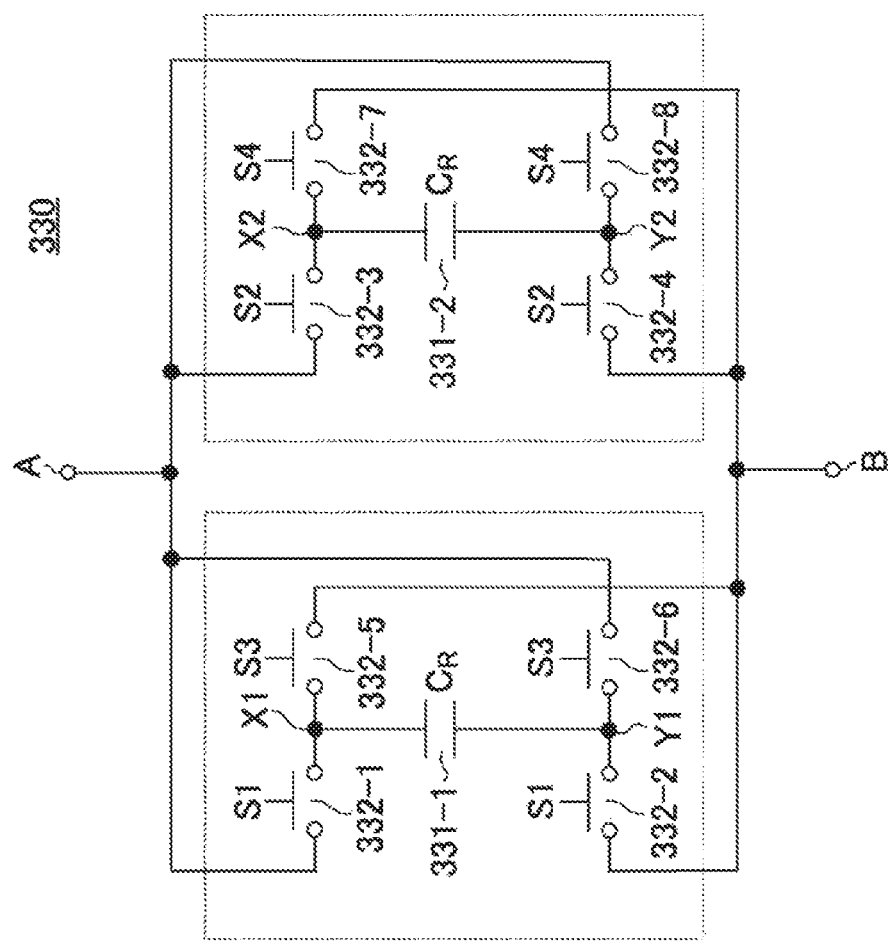
FIG. 11 is a diagram illustrating an example of a charge sharing circuit according to the third embodiment of the present disclosure.

FIG. 11 is a diagram illustrating an example of the charge sharing circuit 330 according to the third embodiment of the present disclosure. The charge sharing circuit 330 shown in FIG. 11 includes, for example, switches 332-1 to 332-8, a capacitor 331-1, and a capacitor 331-2.

The capacitor 331-1 includes a terminal X1 and a terminal Y1. The capacitor 331-2 includes a terminal X2 and a terminal Y2. The capacitance value of the capacitor 331-1 and the capacitance value of the capacitor 331-2 are $C_R$. Note that the capacitance value of the capacitor 331-1 may be different from the capacitance value of the capacitor 331-2. At least one of the capacitor 331-1 and the capacitor 331-2 may be a variable capacitor.

The switch 332-1 is disposed between the terminal X1 and the terminal A. The switch 332-2 is disposed between the terminal Y1 and the terminal B. The switch 332-1 and the switch 332-2 are controlled by the control signal S1.

The switch 332-3 is disposed between the terminal X2 and the terminal A. The switch 332-4 is disposed between the terminal Y2 and the terminal B. The switch 332-3 and the 332-4 are controlled by the control signal S2.

The switch 332-5 is disposed between the terminal X1 and the terminal B. The switch 332-6 is disposed between the terminal Y1 and the terminal A. The switch 332-5 and the 332-6 are controlled by the control signal S3.

The switch 332-7 is disposed between the terminal X2 and the terminal B. The switch 332-8 is disposed between the terminal Y2 and the terminal A. The switch 332-7 and the 332-8 are controlled by the control signal S4.

In the charge sharing circuit 330 shown in FIG. 11, the switches 332-1 to 332-8 turn on and off according to the control signals S1 to S4 shown in FIG. 10B such that four operations described below are performed in each period ($1T_{CK}$), and the four operations are repeated at intervals of the period $T_{CK}$.

First operation: When the control signal S1 is in the high level period, the terminal X1 of the capacitor 331-1 is connected to the terminal A, and the terminal Y1 is connected to the terminal B (hereinafter, this situation is referred to as a positive-phase connection of the capacitor 331-1). Note that when the control signal S1 is in the high level period, the control signals S2 to S4 are in the low level period, and thus the terminals of the capacitor 331-2 are opened and a charge accumulated in the capacitor 331-2 during a fourth operation (described later) is retained therein.

Second operation: When the control signal S2 is in the high level period, the terminal X2 of the capacitor 331-2 is connected to the terminal A, and the terminal Y2 is connected to the terminal B (hereinafter, this situation is referred to as a positive-phase connection of the capacitor 331-2). Note that when the control signal S2 is in the high level period, the control signals S1, S3, and S4 are in the low level period, and thus the terminals of the capacitor 331-1 are opened and a charge accumulated in the capacitor 331-1 during the first operation is retained therein.

Third operation: When the control signal S3 is in the high level period, the terminal Y1 of the capacitor 331-1 is connected to the terminal A, and the terminal X1 is connected to the terminal B (hereinafter, this situation is referred to as a negative-phase connection of the capacitor 331-1). Note that when the control signal S3 is in the high level period, the control signals S1, S2, and S4 are in the low level period, and thus the terminals of the capacitor 331-2 are opened, and a charge accumulated in the capacitor 331-2 during the second operation is retained therein.

Fourth operation: When the control signal S4 is in the high level period, the terminal Y2 of the capacitor 331-2 is connected to the terminal A, and the terminal X2 is connected to the terminal B (hereinafter, this situation is referred to as a negative-phase connection of the capacitor 331-2). Note that when the control signal S4 is in the high level period, the control signals S1 to S3 are in the low level period, and thus the terminals of the capacitor 331-1 are opened and a charge accumulated in the capacitor 331-1 during the third operation is retained therein.

The four operations, that is, the first operation in which the capacitor 331-1 is connected in the positive-phase connection and the charge charge-shared during the negative-phase connection state in the capacitor 331-2 is retained, the second operation in which the capacitor 331-2 is connected in the positive-phase connection and the charge charge-shared during the positive-phase connection state in the capacitor 331-1 is retained, the third operation in which the capacitor 331-1 is connected in the positive-phase connection and the charge charge-shared during the positive-phase connection state in the capacitor 331-2 is retained, and the fourth operation in which the capacitor 331-2 is connected in the negative-phase connection and the charge charge-shared during the negative-phase connection state in the capacitor 331-1 is retained, are performed repeatedly such that one operation is performed in one Ts period and a next operation is performed in a next Ts period.

The capacitor 331-1 and the capacitor 331-2 each operate such that a charge is charge-shared during a positive-phase connection (negative-phase connection) period and the polarity of this retained charge is inverted when a negative-phase connection (positive-phase connection) is made.

That is, in the first to fourth operations described above, the charge sharing circuit 330 connects the capacitor 331-1 such that the polarity of the charge retained in the capacitor 331-1 is inverted while the connection of the capacitor 331-2 is opened and the charge is retained in the capacitor 331-2 (in the first and third operations), and then the capacitor 331-2 is connected such that the polarity of the charge retained in the capacitor 331-2 is inverted while the connection of the capacitor 331-1 is opened and the charge is retained in the capacitor 331-1 (in the second and fourth operations). The above four operations are performed repeatedly such that one operation is performed in one Ts period and a next operation is performed in a next Ts period.

Next, an example of an operation of the phase shifter 300 shown in FIG. 9 is described below for a case where the charge sharing circuit 330 shown in FIG. 11 is used as the charge sharing circuit 330-1 and the charge sharing circuit 330-2 in FIG. 9.

In the I-circuit (which includes the TA 310-1, the capacitor 320-1, and the charge sharing circuit 330-1) shown in FIG. 9, the capacitor 320-1 and the charge sharing circuit 330-1 perform the charge sharing repeatedly every Ts period thereby generating a sample value. The capacitor 320-1 and the charge sharing circuit 330-1 share three types of charges as described below.

(a) A charge obtained as a result of conversion from the input voltage signal $V_{IN\_I}$ to a current performed by the TA 310-1. (b) A charge captured one sampling period before and retained in the capacitor 320-1. (c) A charge captured two sampling periods before and retained in the charge sharing circuit 330-1.

Note that in the three types of sharing, the charge sharing circuit 330 performs charge sharing by inverting the polarity of the charge captured two sampling periods before and retained currently.

The transfer function of the I-circuit (which includes the TA 310-1, the capacitor 320-1, and the charge sharing circuit 330-1) is given by equation (9).

$$H_{CD} = \frac{g_m}{j\omega(C_H + C_R)}\left\{1 - \frac{K_1(1-z^{-1})(1+z^{-1})}{j\omega T_S D}\right\} \quad (9)$$

$C_H$ in equation (9) denotes a capacitance value ($C_{H1}$) of the capacitor 320-1, and $C_R$ denotes the capacitance values of the capacitor 331-1 and the capacitor 331-2 in the charge sharing circuit 330-1. Note that the pulse width Ts is determined by the clock frequency of the control signals. D is given by equation (10).

$$D = 1 - K_0 z^{-1} + K_1 z^{-2} \quad (10)$$

$K_0$ in equation (10) is given by equation (11).

$$K_0 = \frac{C_H}{C_H + C_R} \quad (11)$$

$K_1$ in equation (9) and equation (10) is given by equation (12).

$$K_1 = \frac{C_R}{C_H + C_R} \quad (12)$$

The DC gain of the I-circuit is determined by the transfer function shown in equation (9) as described in equation (13).

$$|H_{CD}(0)| = \frac{g_m K_0}{2K_1(C_H + C_R)f_S} \quad (13)$$

In equation (13), $f_S=1/T_S$. For example, when the duty ratio is 1/4, $f_S=4\,f_{CK}$.

Similarly, a transfer function of a Q-circuit including the TA 310-2, the capacitor 320-2, and the charge sharing circuit 330-2 shown in FIG. 9 is given by equation (9), and the DC gain of the Q-circuit is given by equation (13). In the case of the transfer function of the Q-circuit, $C_H$ in equations (9) to (13) is the capacitance value $C_{H2}$ of the capacitor 320-2, and $C_R$ is the capacitance value of the capacitor 331-1 and the capacitor 331-2 in the charge sharing circuit 330-2.

Method of Controlling Phase

In the phase shifter 300 in which the charge sharing circuit 330 shown in FIG. 11 is used, it is possible to give a gain difference between the gain of the I-circuit and the gain of the Q-circuit by performing control according to at least one of control methods (3-1) to (3-3) described by way of example below, thereby controlling the phase of the signal output from the combining circuit 340.

Control Method (3-1)

Adjust the capacitance value $C_{H1}$ of the capacitor 320-1 and the capacitance value $C_{H2}$ of the capacitor 320-2.

Control Method (3-2)

Adjust the ratio of the capacitance value $C_{H1}$ of the capacitor 320-1 to the capacitance value $C_R$ of the capacitor 331 in the charge sharing circuit 330-1 and the ratio of the capacitance value $C_{H2}$ of the capacitor 320-2 to the capacitance value $C_R$ of the capacitor 331 in the charge sharing circuit 330-2.

Control Method (3-3)

Adjust the clock frequency of the control signals input to the charge sharing circuit 330-1 and the charge sharing circuit 330-2.

It is possible to control the phase of the output signal by at least one of the control methods (3-1) to (3-3) described above.

For example, in a case where the phase of the output signal is controlled using the control method (3-1) and/or the control method (3-2), a relationship between capacitance values and the phase of the output signal is represented by equation (14).

$$\tan \alpha = \frac{K_{0\_I}}{K_{1\_I}(C_{H1}+C_{R1})} \frac{K_{1\_Q}(C_{H2}+C_{R2})}{K_{0\_Q}} \quad (14)$$

In equation (14), $C_{H1}$ is the capacitance value of the capacitor 320-1, $C_{R1}$ is the capacitance value of the capacitor 331-1 and the capacitor 331-2 included in the charge sharing circuit 330-1, $C_{H2}$ is the capacitance value of the capacitor 320-2, and $C_{R2}$ is the capacitance value of the capacitor 331-1 and the capacitor 331-2 included in the charge sharing circuit 330-2. $K_{0\_I}$ is obtained as a result of substituting $C_{H1}$ and $C_{R1}$ respectively into $C_H$ and $C_R$ in equation (11). $K_{1\_I}$ is obtained as a result of substituting $C_{H1}$ and $C_{R1}$ respectively into $C_H$ and $C_R$ in equation (12). $K_{0\_Q}$ is obtained as a result of substituting $C_{H2}$ and $C_{R2}$ respectively into $C_H$ and $C_R$ in equation (11). $K_{1\_Q}$ is obtained as a result of substituting $C_{H2}$ and $C_{R2}$ respectively into $C_H$ and $C_R$ in equation (12). Equation (14) is obtained from equation (13) when the clock frequency of control signals generated by the clock generator 350-1 is set to the clock frequency of control signals generated by the clock generator 350-2.

For example, in a case where the phase of the output signal is controlled using the control method (3-3), the clock frequency of the control signals and the phase control amount α of the output signal has a relationship represented by equation (15).

$$\tan \alpha = \frac{f_{CK2}}{f_{CK1}} \quad (15)$$

In equation (15), $f_{CK1}$ is the clock frequency of control signals generated by the clock generator 350-1, and $f_{CK2}$ is the clock frequency of control signals generated by the clock generator 350-2. Equation (15) is obtained from equation (13), for example, when capacitance values or capacitance ratio are set such that equation (14) has a value of 1.

Next, a phase control characteristic of the phase shifter 300 is described.

Figure 12B:
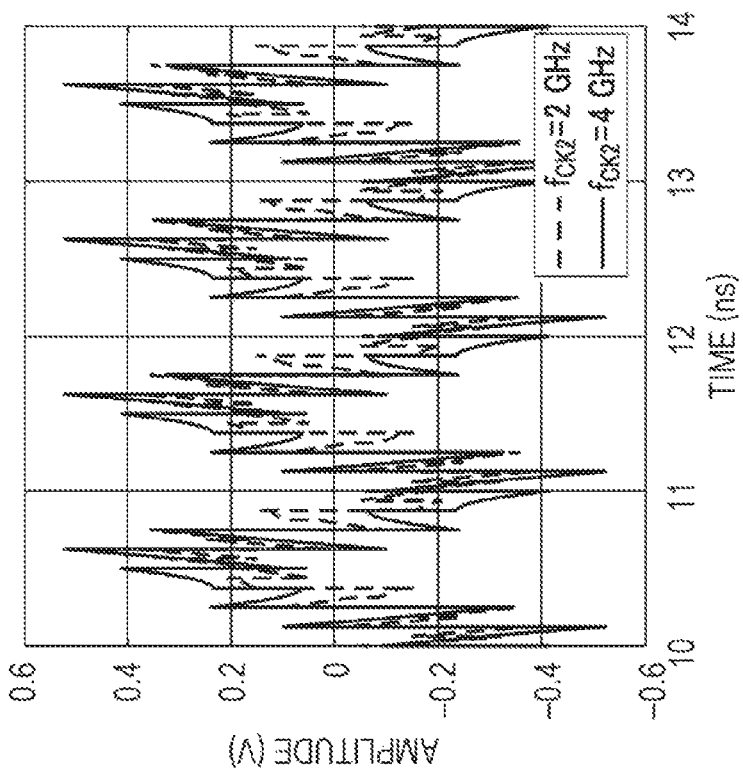
FIG. 12B is a diagram illustrating a second example of a result of simulation of an output waveform output from a phase shifter according to the third embodiment of the present disclosure.
Figure 12A:
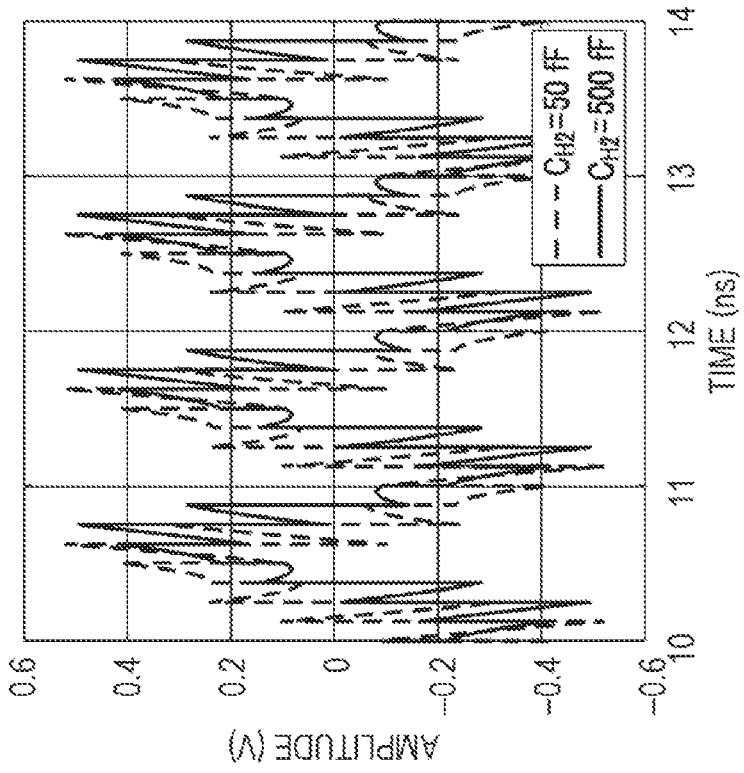
FIG. 12A is a diagram illustrating a first example of a result of simulation of an output waveform output from a phase shifter according to the third embodiment of the present disclosure.

FIG. 12A is a diagram illustrating a first example of a result of simulation of an output waveform output from the phase shifter 300 according to the third embodiment. FIG. 12B is a diagram illustrating a second example of a result of simulation of an output waveform output from the phase shifter 300 according to the third embodiment. In each of FIG. 12A and FIG. 12B, a horizontal axis represents time and a vertical axis represents an output voltage.

The result of the simulation shown in FIG. 12A is for a case where the input signal frequency $f_{in}=1$ [GHz], the input signal power $P_{in}=-30$ [dBm], $g_m=20$ [mS], $C_R=100$ [fF], $C_{H1}=50$ [fF], $f_{CK}=f_{CK1}=f_{CK2}=2$ [GHz], and $C_{H2}=50$ [fF] or 500 [fF]. FIG. 12A shows two results obtained for two respective values of $C_{H2}$, 50 [fF] and 500 [fF], while maintaining $C_{H1}$ at a fixed value of 50 [fF] thereby changing the capacitance ratio between $C_{H1}$ and $C_{H2}$.

FIG. 12A indicates that the phase of the output signal changes depending on the capacitance ratio. As can be seen from FIG. 12A, the phase shifter 300 is capable of adjusting the phase of the output signal by changing the capacitance ratio of $C_{H1}$ to $C_{H2}$.

The result of the simulation shown in FIG. 12B is for a case where the input signal frequency $f_{in}=1$ [GHz], the input signal power $P_{in}=-30$ [dBm], $g_m=20$ [mS], $C_R=100$ [fF], $C_{H1}=C_{H2}=50$ [fF], $f_{CK1}=2$ [GHz], and $f_{CK2}=2$ [GHz] or $f_{CK2}=4$ [GHz]. FIG. 12B shows two results obtained for two respective values of $f_{CK2}$, 2 [GHz] and 4 [GHz], while maintaining $f_{CK1}$ at a fixed value of 2 [GHz] thereby changing the clock frequency ratio between $f_{CK1}$ and $f_{CK2}$.

FIG. 12B indicates that the phase of the output signal changes depending on the clock frequency ratio. As can be seen from FIG. 12B, the phase shifter 300 is capable of adjusting the phase of the output signal by changing the clock frequency.

Furthermore, FIG. 12A indicates that the amplitude changes depending on the capacitance ratio. Furthermore, FIG. 12B indicates that the amplitude changes depending on the clock frequency ratio. That is, FIGS. 12A and 12B indicate that when the phase of the output signal is adjusted, a corresponding change in amplitude of the output signal occurs.

In the configuration described above, it is assumed that an amplifier (for example, the power amplifier 17 shown in FIG. 4A) is connected to the output of the phase shifter 300.

By adjusting the amplitude by the amplifier connected to the output of the phase shifter 300, the amplitude of the output signal that changes in response to an adjustment of the phase of the output signal may be corrected. A variable gain amplifier may be used as the amplifier. Alternatively, the amplifier may be a digital amplifier configured to adjust the output level such that when the amplitude of the output signal is greater than a certain threshold value, the output signal is controlled at a fixed output level.

As described above, in the configuration according to the third embodiment, the phase shifter 300 includes the two voltage-to-current conversion circuits (310-1 and 310-2), the two capacitors (320-1 and 320-2), the two charge sharing circuits (330-1 and 330-2), the combining circuit 340, and the clock generator 350. In the configuration shown in FIG. 9, it is possible to control the phase by controlling the capacitance ratio and/or a parameter (for example, the clock frequency) associated with the control signal.

The phase shifter 300 according to the third embodiment has a simple configuration in which there are only a small number of switches and there is no switch disposed in series in a signal path, which makes it possible to operate at a high speed to handle a wideband signal.

Furthermore, it is possible to achieve a small variation in capacitance ratio even in the CMOS configuration which is sensitive to a process variation, and/or variations of power supply voltage and temperature. Therefore, by using the phase shifter 300 according to the third embodiment in which the phase is controlled by the capacitance ratio, it is possible to achieve a phase control with a small deviation from a design value when the phase shifter 300 is produced using the CMOS process. Thus, it is possible to reduce or simplify a calibration circuit that adjust the variation from the design value, which makes it possible to reduce the size and/or consumption power of a wireless communication apparatus.

In the phase shifter 300 according to the third embodiment, the provision of the equalizer function makes it possible to correct the frequency characteristic. In this configuration, it is not necessary to separately provide an additional equalizer for adjusting the frequency characteristic, which allows a reduction in the apparatus size.

Fourth Embodiment

In the phase shifter 300 according to the third embodiment described above, the charge sharing circuit 330-1 is provided in a path via which the input signal $V_{IN\_I}$ is input, and the charge sharing circuit 330-2 is provided in a path via which the input signal $V_{IN\_Q}$ is input. In a fourth embodiment described below, the configuration of the phase shifter 300 according to the third embodiment is modified such that a charge sharing circuit is provided between the path via which the input signal $V_{IN\_I}$ is input and the path via which the input signal $V_{IN\_Q}$ is input. Note that the configuration according to the present fourth embodiment is a configuration obtained as a result of simplifying the configuration according to the third embodiment.

The transmission apparatus and the reception apparatus according to the fourth embodiment are similar, in configuration, to the transmission apparatus 3 shown in FIG. 4A and the reception apparatus 4 shown in FIG. 4B, and thus a duplicated description of the configurations thereof is omitted. The phase shifter according to the fourth embodiment corresponds to, for example, the phase shifter 35 shown in FIG. 4A or the phase shifter 48 shown in FIG. 4B. Note that in the following description, expressions such as " . . . er", " . . . or" or the like used to indicate constituent elements of the transmission apparatus 3 or the reception apparatus 4 may be replaced by other expressions such as " . . . circuitry", " . . . device", " . . . unit", " . . . module", or the like.

Configuration and Operation of Phase Shifter 400

Figure 13:
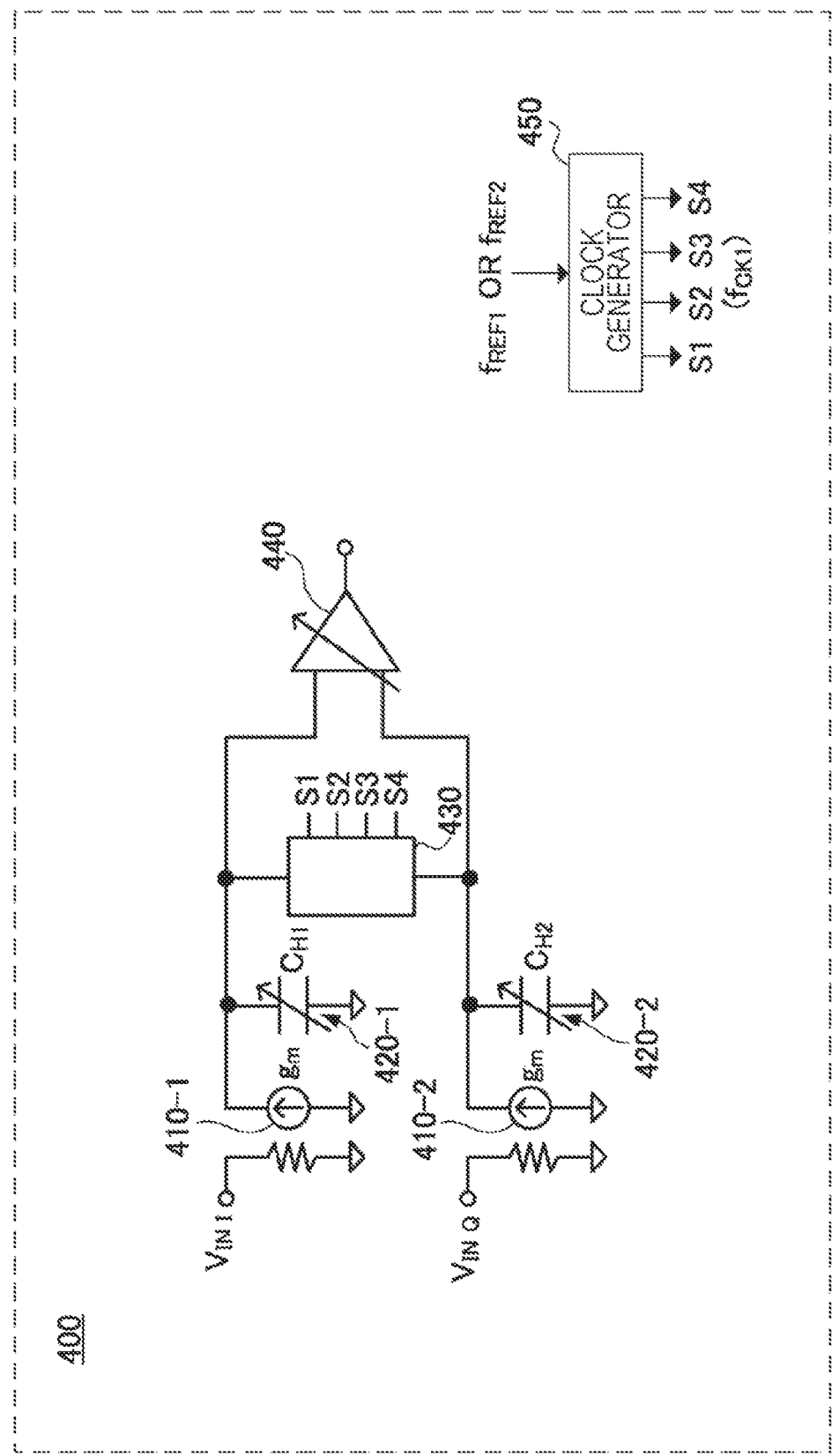
FIG. 13 is a diagram illustrating an example of a configuration of a phase shifter according to a fourth embodiment of the present disclosure.

FIG. 13 is a diagram illustrating an example of a configuration of a phase shifter 400 according to the fourth embodiment. The phase shifter 400 shown in FIG. 13 includes, for example, a TA 410-1, a TA 410-2, a capacitor 420-1, a capacitor 420-2, a charge sharing circuit 430, a combining circuit 440, and a clock generator 450.

The TA 410-1, the TA 410-2, the capacitor 420-1, the capacitor 420-2, and the combining circuit 440 shown in FIG. 13 are respectively similar to the TA 110-1, the TA 110-2, the capacitor 120-1, the capacitor 120-2, and the combining circuit 130 shown in FIG. 2. The capacitance value of the capacitor 420-1 and the capacitance value of the capacitor 420-2 are respectively $C_{H1}$ and $C_{H2}$.

The clock generator 450 generates control signals S1, S2, S3, and S4 using a reference frequency signal $f_{REF1}$ output from a reference frequency oscillator 33 (refer to FIG. 4A) or a reference frequency signal $f_{REF2}$ output from a reference frequency oscillator 43 (refer to FIG. 4B), and outputs them to the charge sharing circuit 430. The clock frequency of the control signals S1, S2, S3, and S4 is, for example, $f_{CK}$.

One of electrodes of the charge sharing circuit 430 is connected to the output of the TA 410-1, and the other one of electrodes is connected to the output of the TA 410-2. The charge sharing circuit 430 is input with control signals generated by the clock generator 450.

Note that a system that includes a TA 410-1 and a capacitor 420-1 shown in FIG. 13 and that operates in response to an input signal $V_{IN\_I}$ may be called an I-circuit, and a system that includes a TA 410-2 and a capacitor 420-2 shown in FIG. 13 and that operates in response to an input signal $V_{IN\_Q}$ may be called a Q-circuit. Note that in the fourth embodiment, the charge sharing circuit 430 is shared by both the I-circuit and the Q-circuit.

Next, an example of the charge sharing circuit 430 and examples of the control signals S1, S2, S3, and S4 output from the clock generator 350 are described below.

The configuration of the charge sharing circuit 430 may be similar to, for example, the configuration of the charge sharing circuit 330 shown in FIG. 10A or FIG. 11. The charge sharing circuit 430 is input with the control signals S1 to S4 generated by the clock generator 450. Note that the control signals each may also be called a clock. The control signals may have waveforms similar to, for example, those shown in FIG. 10B.

Note that in the following description, a time period in which the control signal S1 is at a "high" level shown in FIG. 10B may be referred to as a high level period of the control signal S1, and a time period in which the control signal S1 is at a "low" level shown in FIG. 10B may be referred to as a low level period of the control signal S1. High and low level periods may be defined in a similar manner also for the control signals S2 to S4.

Next, an example of an operation of the phase shifter 400 shown in FIG. 13 is described below for a case where the charge sharing circuit 330 shown in FIG. 11 is used as the charge sharing circuit 430 in FIG. 13. More specifically, the operation of the phase shifter 400 is described below, by way of example, for a case where the terminal A shown in FIG. 11 is connected to the capacitor 420-1, and the terminal B is connected to the capacitor 420-2.

The phase shifter 400 operates in a period in which the control signal S1 is at the high level, in a period in which the control signal S2 is at the high level, in a period in which the control signal S3 is at the high level, and in a period in which the control signal S4 is at the high level, and the operations in these periods are performed repeatedly such that one operation is performed in a period and a next operation is performed in a next period. The operation in each period is performed as follows.

In the period in which the control signal S1 is at the high level, the terminal X1 of the capacitor 331-1 ($C_R$) is connected to the capacitor 420-1 ($C_{H1}$), and the terminal Y1 of the capacitor 331-1 ($C_R$) is connected to the capacitor 420-2 ($C_{H2}$).

In the period in which the control signal S2 is at the high level, the terminal X2 of the capacitor 331-2 ($C_R$) is connected to the capacitor 420-1 ($C_{H1}$), and the terminal Y2 of the capacitor 331-2 ($C_R$) is connected to the capacitor 420-2 ($C_{H2}$).

In the period in which the control signal S3 is at the high level, the terminal Y1 of the capacitor 331-1 ($C_R$) is connected to the capacitor 420-1 ($C_{H1}$), and the terminal X1 of the capacitor 331-1 ($C_R$) is connected to the capacitor 420-2 ($C_{H2}$). In the period in which the control signal S3 is at the high level, the capacitor 331-1 is connected between the capacitor 420-1 and the capacitor 420-2 such that the connection direction thereof is opposite to the direction in the period in which the control signal S1 is at the high level.

In the period in which the control signal S4 is at the high level, the terminal Y2 of the capacitor 331-2 ($C_R$) is connected to the capacitor 420-1 ($C_{H1}$), and the terminal X2 of the capacitor 331-2 ($C_R$) is connected to the capacitor 420-2 ($C_{H2}$). In the period in which the control signal S4 is at the high level, the capacitor 331-2 is connected between the capacitor 420-1 and the capacitor 420-2 such that the connection direction is opposite to the direction in the period in which the control signal S2 is at the high level.

It is possible to control the phase of the output signal by combining, via the capacitor 331-1 and the capacitor 331-2, the I-signal input from the TA 410-1 and the Q-signal with a 90°-shifted phase input from the TA 410-2.

Method of Controlling Phase

In the phase shifter 400 shown in FIG. 13, in a case where the charge sharing circuit 330 shown in FIG. 11 is used as the charge sharing circuit 430, it is possible to give a gain difference between the gain of the I-circuit and the gain of the Q-circuit by performing control according to a control method described by way of example below thereby controlling the phase of the signal output from the combining circuit 440.

Control Method

Adjust the ratio of the capacitance value $C_{H1}$ of the capacitor 420-1 to the capacitance value $C_R$ of the capacitor 331 (see FIG. 11) in the charge sharing circuit 430, and the ratio of the capacitance value $C_{H2}$ of the capacitor 420-2 to the capacitance value $C_R$ of the capacitor 331 (see FIG. 11) in the charge sharing circuit 430.

Next, a phase control characteristic of the phase shifter 300 is described.

Figure 14A:
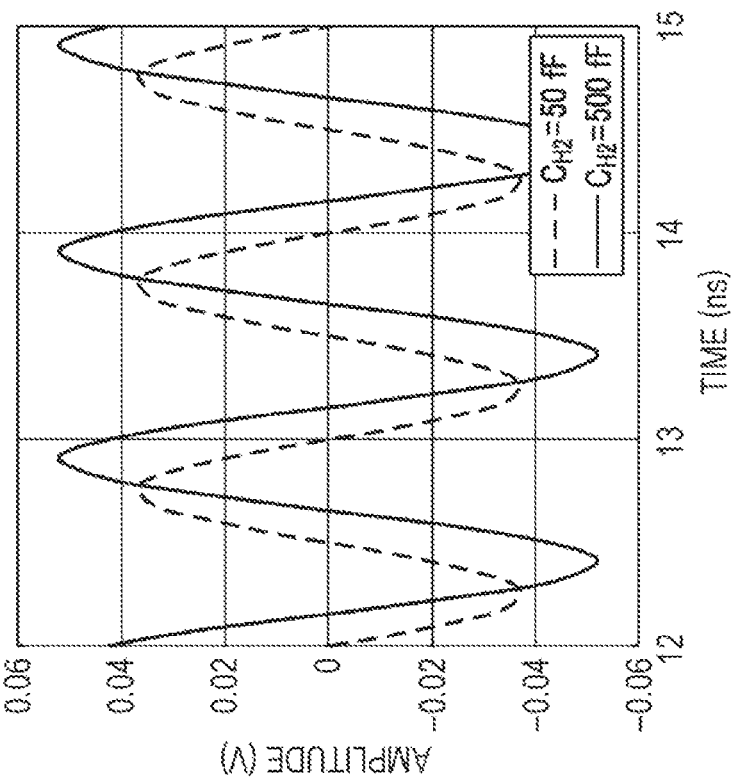
FIG. 14A is a diagram illustrating a first example of a result of simulation of an output waveform output from a phase shifter according to the fourth embodiment of the present disclosure.
Figure 14B:
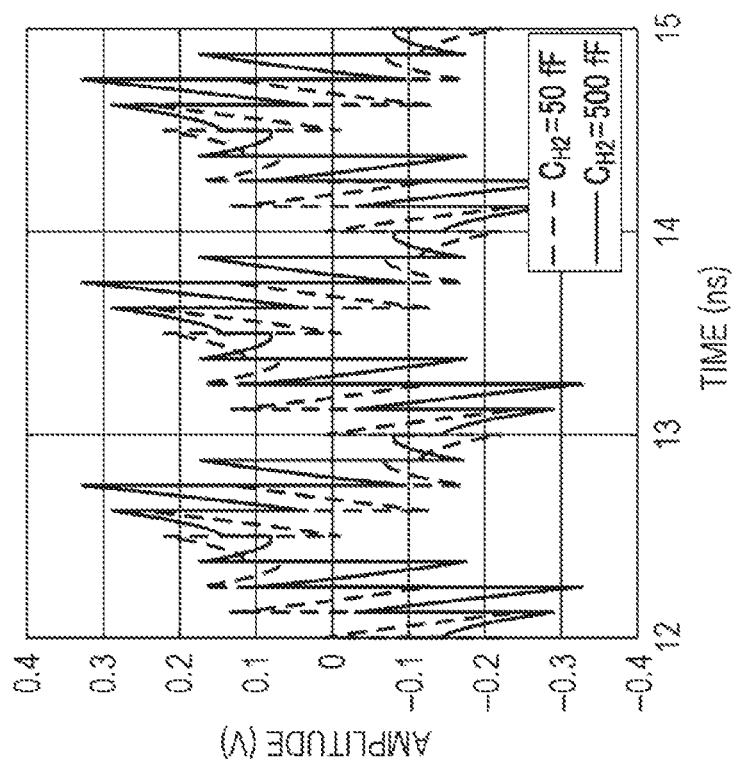
FIG. 14B is a diagram illustrating an example of a result of simulation of an output waveform for a case where a lowpass filter is connected to a phase shifter according to the fourth embodiment of the present disclosure.

FIG. 14A is a diagram illustrating a first example of a result of simulation of an output waveform output from the phase shifter 400 according to the fourth embodiment. FIG. 14B is a diagram illustrating an example of a result of simulation of an output waveform for a case where a lowpass filter is connected to the phase shifter 400 according to the fourth embodiment. In each of FIG. 14A and FIG. 14B, a horizontal axis represents time and a vertical axis represents an output voltage.

The result of the simulation shown in FIG. 14A is for a case where the input signal frequency $f_{in}$=1 [GHz], the input signal power $P_{in}$=−30 [dBm], $g_m$=20 [mS], $C_R$=100 [fF], $C_{H1}$=50 [fF], $f_{CK}$=2 [GHz], and $C_{H2}$=50 [fF] or 500 [fF]. FIG. 14A shows results obtained for two respective values 50 [fF] and 500 [fF] for $C_{H2}$, while maintaining $C_{H1}$ at a fixed value of 50 [fF] thereby changing the capacitance ratio between $C_{H1}$ and $C_{H2}$.

FIG. 14A indicates that the phase of the output signal changes depending on the capacitance ratio. As can be seen from FIG. 14A, it is possible to adjust the phase of the output signal from the phase shifter 400 by changing the capacitance ratio of $C_{H1}$ to $C_{H2}$.

FIG. 14B is a diagram illustrating an example of a result of simulation of an output waveform for a case where a lowpass filter is connected to the phase shifter 400. In this configuration in which the lowpass filter is connected to the phase shifter 400, a low frequency component of the output waveform (see, for example, FIG. 14A) output from the phase shifter 400 is output from the lowpass filter, but a high frequency component of the output waveform output from the phase shifter 400 is suppressed. For example, abrupt changes in amplitude (such as sharp peaks) occur in the output waveform in FIG. 14A, but abrupt changes are suppressed and smooth output waveform is obtained in FIG. 14B.

In the configuration described here, it is assumed that an amplifier (for example, the power amplifier 17 shown in FIG. 4A) is connected to the output of the phase shifter 400. By adjusting the amplitude of the signal by the amplifier connected to the output of the phase shifter 400, the amplitude of the output signal may be corrected so as to cancel out the change that occurs in response to a change in the phase of the output signal. A variable gain amplifier may be used as the amplifier. Alternatively, the amplifier may be a digital amplifier configured to adjust the output level such that when the amplitude of the output signal is greater than a certain threshold value, the output signal is controlled at a fixed output level.

As described above, in the configuration according to the third embodiment, the phase shifter 400 includes the two voltage-to-current conversion circuits (410-1 and 410-2), the two capacitors (420-1 and 420-2), one charge sharing circuit (430), the combining circuit 440, and the clock generator 450. In the configuration shown in FIG. 13, it is possible to control the phase by controlling the capacitance ratio.

The phase shifter 400 according to the fourth embodiment has a simple configuration in which there are only a small number of switches and there is no switch disposed in series in a signal path, which makes it possible to operate at a high speed to handle a wideband signal.

Note that capacitors used in each embodiment described above may be capacitors having fixed capacitance values or may be variable capacitors whose capacitance values are variable.

The present disclosure can be realized by software, hardware, or software in cooperation with hardware.

Each functional block used in the description of each embodiment described above can be partly or entirely realized by an LSI such as an integrated circuit, and each process described in each embodiment may be controlled partly or entirely by a single LSI or a combination of LSIs. The LSI may be individually formed by chips, or the LSI may include only one chip on which a part or all of the functional blocks are formed. The LSI may include a data input and a data output. The LSI here may be referred to as an IC, a system LSI, a super LSI, or an ultra LSI depending on a difference in the degree of integration.

The technique of implementing an integrated circuit is not limited to the LSI and may be realized by using a dedicated circuit, a general-purpose processor, or a special-purpose processor. The integrated circuit may also be realized using an FPGA (Field Programmable Gate Array) that can be programmed after the manufacture of the LSI or a reconfigurable processor that is allowed to be reconfigured in terms of the connection or the setting of circuit cells in the inside of the LSI. The present disclosure can be realized as digital processing or analogue processing.

When a new integrated circuit technique other than LSI techniques are realized in the future by an advance in semiconductor technology or related technology, the functional blocks may be realized using such a new technique. A possible example of a new technique is biotechnology.

The present disclosure may be implemented in a wide variety of apparatuses, devices, and systems (generically referred to as a communication apparatus) having a communication function. Non-limiting examples of communication apparatuses include a telephone (a portable telephone, a smartphone, etc.), a tablet computer, a personal computer (PC) (a laptop computer, a desktop computer, a notebook computer, etc.), a camera (a digital camera, a still camera, a video camera, etc.), a digital player (a digital audio/video player, etc.), a wearable device (a wearable camera, a smart watch, a tracking device, etc.), a tame console, a digital book reader, a telehealth/telemedicine device, a vehicle/transportation (a car, an air plane, a ship, etc.) having a communication capability, and various combinations of apparatuses described above.

The communication apparatuses are not limited to those of potable or mobile types, but the communication apparatuses may also include a wide variety of unportable or firmly-installed apparatuses, devices, and systems, such as a smart home device (a home electric appliance, lighting equipment, a smart meter, a measuring instrument, a control panel, etc.), a vending machine, and other many things located on an IoT (Internet of Things).

The communication may include data communication using a cellular system, a wireless LAN system, a satellite communication system and/or the like, and data communication using an arbitrary combination thereof.

The communication apparatuses include a device such as a controller, a sensor, or the like connected or coupled to a communication device capable of executing a communication function according to the present disclosure. A specific example may be a controller or a sensor configured to generate a control signal, a data signal, or the like for use by a communication device that executes a communication function of a communication apparatus.

Furthermore, the communication apparatuses may also include an infrastructure facility such as a base station, an access point, etc., and other many apparatuses, devices, and systems that communicate with or control the above-described non-limiting apparatuses.

The present disclosure may also be implemented as a control method executed by a wireless communication apparatus or a control apparatus. The present disclosure may also be implemented as a program for executing the control method on a computer. The present disclosure may be represented by storing the program in a storage medium such that the program may be readable by a computer. That is, the present disclosure may be implemented in any of forms including an apparatus, a method, a program, and a storage medium.

Various embodiments have been described above with reference to drawings. However, the present disclosure are not limited to these embodiments. It should be understood by those skilled in the art that various modifications or alterations may occur within the scope of the present disclosure. Note that such modifications or alterations also fall within the scope of the present disclosure. Furthermore, various combinations of constituent elements of the embodiments may occur without departing from the scope of the present disclosure.

SUMMARY OF THE PRESENT DISCLOSURE

In an aspect, the present disclosure provides a phase shifter including a first capacitor connected to a first line to which a first input signal is input, a second capacitor connected to a second line to which a second input signal having a first phase difference with respect to the first input signal is input, and a combining circuit that is connected to the first line and the second line and that outputs a combined signal having a phase determined depending on a first capacitance ratio between the first capacitor and the second capacitor.

In the phase shifter according to the present disclosure, the first phase difference may be equal to $n \times \pi/2$ where n is an integer greater than or equal to 1.

The phase shifter according to the present disclosure may further include a third capacitor that is connected to the first line and disconnected from the first line repeatedly in a first period, and a fourth capacitor that is connected to the second line and disconnected from the second line repeatedly in a second period, wherein the combined signal may have a phase determined depending on the first capacitance ratio, a second capacitance ratio between the third capacitor and the fourth capacitor, the first period, and the second period.

In the phase shifter according to the present disclosure, the third capacitor may be connected to the first line in a one-half period of the first period and disconnected from the first line in the other one-half period of the first period, and the fourth capacitor may be connected to the second line in a one-half period of the second period and disconnected from the second line in the other one-half period of the second period.

In the phase shifter according to the present disclosure, when the third capacitor is in a period in which the third capacitor is disconnected from the first line, the third capacitor may retain a charge accumulated in a period in which the third capacitor is connected to the first line, and when the fourth capacitor is in a period in which the fourth capacitor is disconnected from the second line, the fourth capacitor may retain a charge accumulated in a period in which the fourth capacitor is connected to the second line.

In the phase shifter according to the present disclosure, when the third capacitor is in a period in which the third capacitor is disconnected from the first line, the third capacitor may discharge a charge accumulated in a period in which the third capacitor is connected to the first line, and when the fourth capacitor is in a period in which the fourth capacitor is disconnected from the second line, the fourth capacitor may discharge a charge accumulated in a period in which the fourth capacitor is connected to the second line.

The phase shifter according to the present disclosure may further include a fifth capacitor having two terminals one of which is connected to the first line in a third period and the other one of which is connected to the first line in a period shifted from the third period by one-half of the third period, a sixth capacitor having two terminals one of which is connected to the first line in a period shifted from the third period by one-fourth of the third period and the other one of which is connected to the first line in a period shifted from the third period by three-fourth of the third period, a seventh capacitor having two terminals one of which is connected to the second line in a fourth period and the other one of which is connected to the fourth line in a period shifted from the fourth period by one-half of the fourth period, and an eighth capacitor having two terminals one of which is connected to the second line in a period shifted from the fourth period by one-fourth of the fourth period and the other one of which is connected to the second line in a period shifted from the fourth period by three-fourth of the fourth period, wherein the combined signal may have a phase determined depending on the first capacitance ratio, a third capacitance ratio determined from values of the fifth to eighth capacitors, the third period, and the fourth period.

In the phase shifter according to the present disclosure, the one of the two terminals of the fifth capacitor may be connected to the first line in a one-fourth period of the third period, and the one of the two terminals of the seventh capacitor may be connected to the second line in a one-fourth period of the fourth period.

The phase shifter according to the present disclosure may further include a ninth capacitor having a first terminal and a second terminal that are connected such that in a fifth period, the first terminal is connected to the first line and the second terminal is connected to the second line, while in a period shifted from the fifth period by one-half of the fifth period, the second terminal is connected to the first line and the first terminal is connected to the second line, and a tenth capacitor having a third terminal and a fourth terminal that are connected such that in a period shifted from the fifth period by one-fourth of the fifth period, the third terminal is connected to the first line and the fourth terminal is connected to the second line, while in a period shifted from the fifth period by a three-fourth of the fifth period, the fourth terminal is connected to the first line and the third terminal is connected to the second line, wherein the combined signal may have a phase determined depending on the first capacitance ratio, a fourth capacitance ratio determined from values of the ninth and tenth capacitors.

In an aspect, the present disclosure provides a wireless communication apparatus including a plurality of phase shifters according to the present disclosure, wherein a beam having a controlled directivity may be formed by controlling the combined signal of each of the plurality of phase shifters.

A phase shifter according to an aspect of the present disclosure is useful in a high frequency signal processing circuit and a baseband signal processing circuit in a wireless communication apparatus, and is useful in a phase control process.

What is claimed is:

1. A phase shifter comprising:
a first capacitor connected to a first line to which a first input signal is input;
a second capacitor connected to a second line to which a second input signal, having a first phase difference with respect to the first input signal, is input;
a combining circuit that is connected to the first line and the second line and that outputs a combined signal having a phase;
a third capacitor that is connected to the first line and disconnected from the first line repeatedly in a first period; and
a fourth capacitor that is connected to the second line and disconnected from the second line repeatedly in a second period,
wherein the phase of the combined signal is determined depending on a first capacitance ratio between the first capacitor and the second capacitor, a second capacitance ratio between the third capacitor and the fourth capacitor, the first period, and the second period.

2. The phase shifter according to claim 1, wherein the first phase difference is equal to $n \times \pi/2$ where n is an integer greater than or equal to 1.

3. The phase shifter according to claim 1, wherein:
the third capacitor is connected to the first line in a one-half period of the first period and disconnected from the first line in the other one-half period of the first period, and
the fourth capacitor is connected to the second line in a one-half period of the second period and disconnected from the second line in the other one-half period of the second period.

4. The phase shifter according to claim 1, wherein:
when the third capacitor is in a period in which the third capacitor is disconnected from the first line, the third capacitor retains a charge accumulated in a period in which the third capacitor is connected to the first line, and
when the fourth capacitor is in a period in which the fourth capacitor is disconnected from the second line, the fourth capacitor retains a charge accumulated in a period in which the fourth capacitor is connected to the second line.

5. The phase shifter according to claim 1, wherein:
when the third capacitor is in a period in which the third capacitor is disconnected from the first line, the third capacitor discharges a charge accumulated in a period in which the third capacitor is connected to the first line, and
when the fourth capacitor is in a period in which the fourth capacitor is disconnected from the second line, the fourth capacitor discharges a charge accumulated in a period in which the fourth capacitor is connected to the second line.

6. A wireless communication apparatus comprising:
a plurality of phase shifters according to claim 1,
wherein a beam having a controlled directivity is formed by controlling the combined signal of each of the plurality of phase shifters.

7. A phase shifter, comprising:
a first capacitor connected to a first line to which a first input signal is input;
a second capacitor connected to a second line to which a second input signal, having a first phase difference with respect to the first input signal, is input;
a combining circuit that is connected to the first line and the second line and that outputs a combined signal having a phase;
a third capacitor having two terminals one of which is connected to the first line in a first period and the other one of which is connected to the first line in a period shifted from the first period by one-half of the first period;
a fourth capacitor having two terminals one of which is connected to the first line in a period shifted from the first period by one-fourth of the first period and the other one of which is connected to the first line in a period shifted from the first period by three-fourth of the first period;

a fifth capacitor having two terminals one of which is connected to the second line in a second period and the other one of which is connected to the second line in a period shifted from the second period by one-half of the second period; and a sixth capacitor having two terminals one of which is connected to the second line in a period shifted from the second period by one-fourth of the second period and the other one of which is connected to the second line in a period shifted from the second period by three-fourth of the second period, wherein the phase of the combined signal is determined depending on a first capacitance ratio between the first capacitor and the second capacitor, a second capacitance ratio determined from values of the third to sixth capacitors, the first period, and the second period.

8. The phase shifter according to claim 7, wherein the one of the two terminals of the third capacitor is connected to the first line in a one-fourth period of the first period, and the one of the two terminals of the fifth capacitor is connected to the second line in a one-fourth period of the second period.

9. A phase shifter, comprising:

a first capacitor connected to a first line to which a first input signal is input;

a second capacitor connected to a second line to which a second input signal, having a first phase difference with respect to the first input signal, is input;

a combining circuit that is connected to the first line and the second line and that outputs a combined signal having a phase;

a third capacitor having a first terminal and a second terminal that are connected such that in a first period, the first terminal is connected to the first line and the second terminal is connected to the second line, while in a period shifted from the first period by one-half of the first period, the second terminal is connected to the first line and the first terminal is connected to the second line; and a fourth capacitor having a third terminal and a fourth terminal that are connected such that in a period shifted from the first period by one-fourth of the first period, the third terminal is connected to the first line and the fourth terminal is connected to the second line, while in a period shifted from the first period by a three-fourth of the first period, the fourth terminal is connected to the first line and the third terminal is connected to the second line, wherein the phase of the combined signal is determined depending on a first capacitance ratio between the first capacitor and the second capacitor and a second capacitance ratio determined from values of the third and fourth capacitors.

* * * * *